(12) United States Patent
Kim et al.

(10) Patent No.: US 10,665,498 B2
(45) Date of Patent: May 26, 2020

(54) SEMICONDUCTOR DEVICE HAVING AIR GAP SPACER AND METHOD OF FABRICATING THE SAME

(71) Applicant: SAMSUNG ELECTRONICS CO., LTD., Suwon-si, Gyeonggi-do (KR)

(72) Inventors: Eun-Jung Kim, Daegu (KR); Bong-Soo Kim, Yongin-si (KR); Yong-Kwan Kim, Yongin-si (KR); Sung-Hee Han, Hwaseong-si (KR); Yoo-Sang Hwang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 15 days.

(21) Appl. No.: 15/196,273

(22) Filed: Jun. 29, 2016

(65) Prior Publication Data

US 2017/0005097 A1 Jan. 5, 2017

(30) Foreign Application Priority Data

Jun. 30, 2015 (KR) .................. 10-2015-0093407

(51) Int. Cl.

| | |
|---|---|
| *H01L 23/48* | (2006.01) |
| *H01L 23/52* | (2006.01) |
| *H01L 29/40* | (2006.01) |
| *H01L 21/768* | (2006.01) |
| *H01L 23/528* | (2006.01) |
| *H01L 23/522* | (2006.01) |
| *H01L 23/532* | (2006.01) |
| *H01L 27/108* | (2006.01) |

(52) U.S. Cl.
CPC ........ *H01L 21/7682* (2013.01); *H01L 23/528* (2013.01); *H01L 23/5226* (2013.01); *H01L 23/53295* (2013.01); *H01L 27/10885* (2013.01); *H01L 27/10888* (2013.01)

(58) Field of Classification Search
CPC ............... H01L 23/5226; H01L 23/528; H01L 23/53295; H01L 27/10885; H01L 27/10888; H01L 21/7682
USPC ......................................... 257/774, 906–908
See application file for complete search history.

(56) References Cited

U.S. PATENT DOCUMENTS

| | | |
|---|---|---|
| 8,962,472 B2 | 2/2015 | Rho et al. |
| 8,999,797 B2 | 4/2015 | Joung et al. |

(Continued)

FOREIGN PATENT DOCUMENTS

KR    10-2014-0082281 A    7/2014

*Primary Examiner* — Kimberly N Rizkallah
*Assistant Examiner* — Dilinh P Nguyen
(74) *Attorney, Agent, or Firm* — Lee IP Law, PC

(57) ABSTRACT

A semiconductor device, including an active region defined in a semiconductor substrate; a first contact plug on the semiconductor substrate, the first contact plug being connected to the active region; a bit line on the semiconductor substrate, the bit line being adjacent to the first contact plug; a first air gap spacer between the first contact plug and the bit line; a landing pad on the first contact plug; a blocking insulating layer on the bit line; and an air gap capping layer on the first air gap spacer, the air gap capping layer vertically overlapping the first air gap spacer, the air gap capping layer being between the blocking insulating layer and the landing pad, an upper surface of the blocking insulating layer being at a height equal to or higher than an upper surface of the landing pad.

5 Claims, 32 Drawing Sheets

(56) References Cited

U.S. PATENT DOCUMENTS

| | | |
|---|---|---|
| 8,999,837 B2 | 4/2015 | Park et al. |
| 9,024,371 B2 | 5/2015 | Lee et al. |
| 9,117,696 B2 | 8/2015 | Kim et al. |
| 9,159,609 B2 | 10/2015 | Lee et al. |
| 9,165,934 B2 | 10/2015 | Choi et al. |
| 9,177,958 B2 | 11/2015 | Ryu et al. |
| 9,196,630 B2 | 11/2015 | Lee et al. |
| 2013/0292847 A1 | 11/2013 | Choi et al. |
| 2013/0328199 A1* | 12/2013 | Yun .................. H01L 23/49866 |
| | | 257/754 |
| 2014/0110816 A1* | 4/2014 | Kim .................. H01L 27/10855 |
| | | 257/499 |
| 2015/0035050 A1 | 2/2015 | Yeom et al. |
| 2015/0061134 A1 | 3/2015 | Lee et al. |
| 2015/0076693 A1 | 3/2015 | Lee |
| 2015/0126013 A1* | 5/2015 | Hwang ............. H01L 27/10888 |
| | | 438/381 |
| 2015/0228754 A1* | 8/2015 | Sung ................. H01L 29/6656 |
| | | 438/595 |
| 2016/0181143 A1* | 6/2016 | Kwon ............... H01L 27/1052 |
| | | 438/586 |

\* cited by examiner

1200

1300

1400

SEMICONDUCTOR DEVICE HAVING AIR GAP SPACER AND METHOD OF FABRICATING THE SAME

CROSS-REFERENCE TO RELATED APPLICATION

Korean Patent Application No. 10-2015-0093407, filed on Jun. 30, 2015, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of manufacturing the semiconductor device.

2. Description of the Related Art

As semiconductor devices have higher capacity and become more highly integrated, design rules may change. A change in design rules may also occur in dynamic random access memories (DRAMs), which are one type of memory semiconductor devices.

SUMMARY

Embodiments may be realized by providing a semiconductor device, including an active region defined in a semiconductor substrate; a first contact plug on the semiconductor substrate, the first contact plug being connected to the active region; a bit line on the semiconductor substrate, the bit line being adjacent to the first contact plug; a first air gap spacer between the first contact plug and the bit line; a landing pad on the first contact plug; a blocking insulating layer on the bit line; and an air gap capping layer on the first air gap spacer, the air gap capping layer vertically overlapping the first air gap spacer, the air gap capping layer being between the blocking insulating layer and the landing pad, an upper surface of the blocking insulating layer being at a height equal to or higher than an upper surface of the landing pad.

The first air gap spacer may include a first air gap vertically overlapped by the landing pad and a second air gap not vertically overlapped by the landing pad.

A height from the semiconductor substrate to a lowest part of the blocking insulating layer may be lower than a height from the semiconductor substrate to a highest part of the first air gap spacer.

The semiconductor device may further include a second contact plug separated from the first contact plug in a first direction perpendicular to an upper surface of the semiconductor substrate; a second air gap spacer on a sidewall of the second contact plug; and an intermediate insulating layer between the first contact plug and the second contact plug. The blocking insulating layer may include a partial layer connecting the first air gap spacer and the second air gap spacer.

The semiconductor device may further include a second contact plug separated from the first contact plug in a first direction perpendicular to an upper surface of the semiconductor substrate; and an intermediate insulating layer between the first contact plug and the second contact plug. The blocking insulating layer may include a first partial layer on both sidewalls of the intermediate insulating layer adjacent to the first and second contact plugs.

The blocking insulating layer may further include a second partial layer connecting the first partial layers.

The blocking insulating layer may further include a third partial layer covering an upper surface of the intermediate insulating layer.

The first and second partial layers may surround sidewalls of the intermediate insulating layer.

The blocking insulating layer may contain silicon nitride.

The blocking insulating layer may include a silicon oxide layer remaining on an inside of sidewalls thereof.

Embodiments may be realized by providing a semiconductor device, including a bit line on a substrate; a contact plug on the substrate, the contact plug being adjacent to the bit line; a bit line spacer on sidewalls of the bit line; a contact plug spacer on sidewalls of the contact plug; an air gap capping layer on the bit line spacer and the contact plug spacer; and an air gap spacer defined by the bit line spacer, the contact plug spacer, and the air gap capping layer.

A height from a bottom surface of the bit line to a highest part of the air gap spacer may be substantially equal to a height from the bottom surface of the bit line to a highest part of the contact plug spacer.

The semiconductor device may further include a landing pad on an upper surface of the contact plug. The landing pad may not cover the air gap capping layer.

The air gap spacer may include a first air gap and a second air gap. The first air gap may be vertically overlapped by the landing pad, and the second air gap may not be vertically overlapped by the landing pad.

The semiconductor device may further include a trench in the landing pad. The second air gap may be connected to a lower surface of the trench.

Embodiments may be realized by providing a semiconductor device, including a bit line; a contact plug connected to an active region in a substrate; a contact plug spacer contacting the contact plug; a bit line spacer contacting the bit line; and a spacer between the contact plug spacer and the bit line spacer, the spacer having a low-k dielectric constant.

The spacer may include air.

The semiconductor device may further include a capping layer on the contact plug spacer.

The semiconductor device may further include a barrier metal on the bit line; and a landing pad covering the barrier metal.

The semiconductor device may further include a trench in the landing pad.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
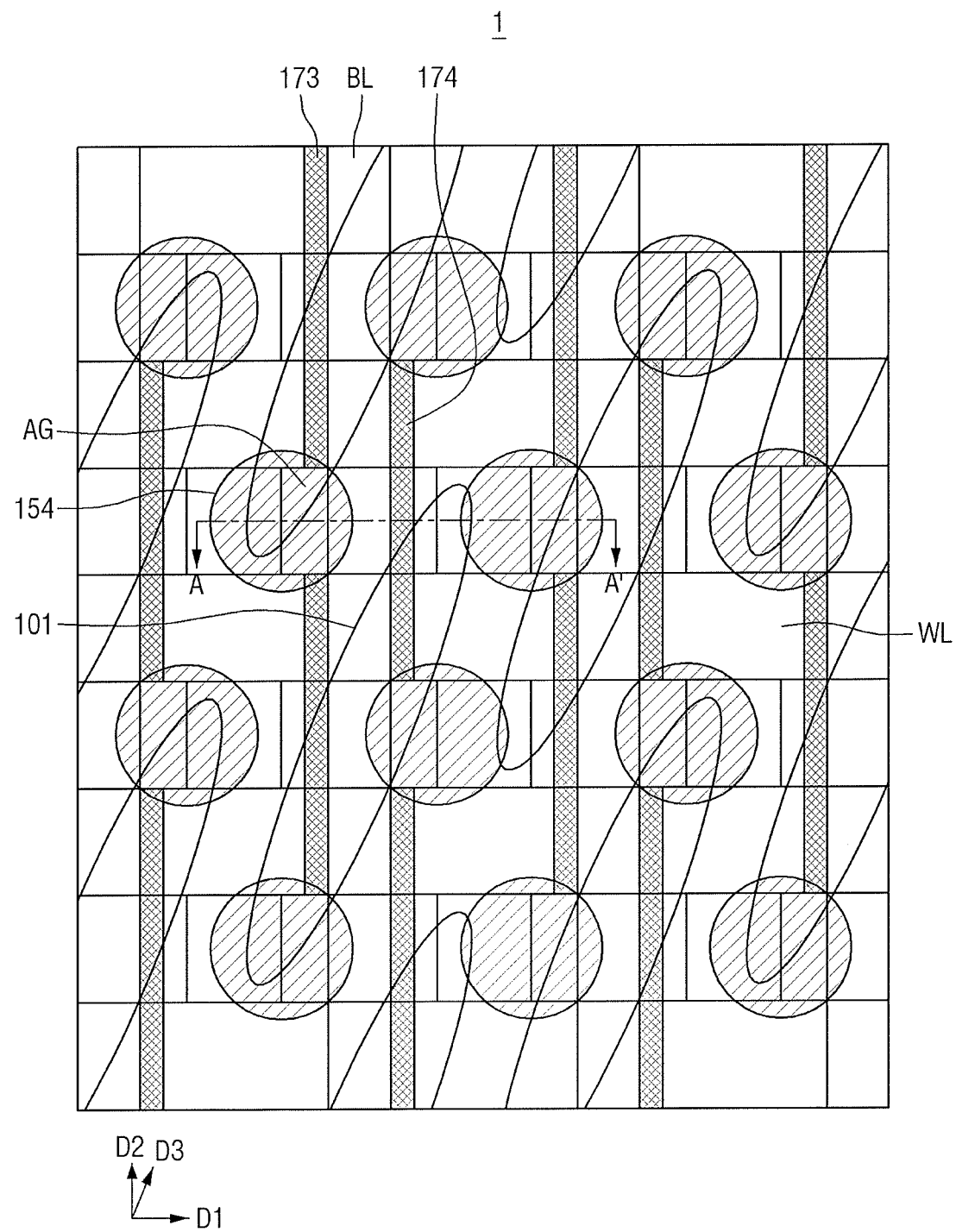
FIG. 1 illustrates a top view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout the specification.

The terminology used herein is for the purpose of describing particular embodiments only and is not intended to be limiting of the embodiment. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
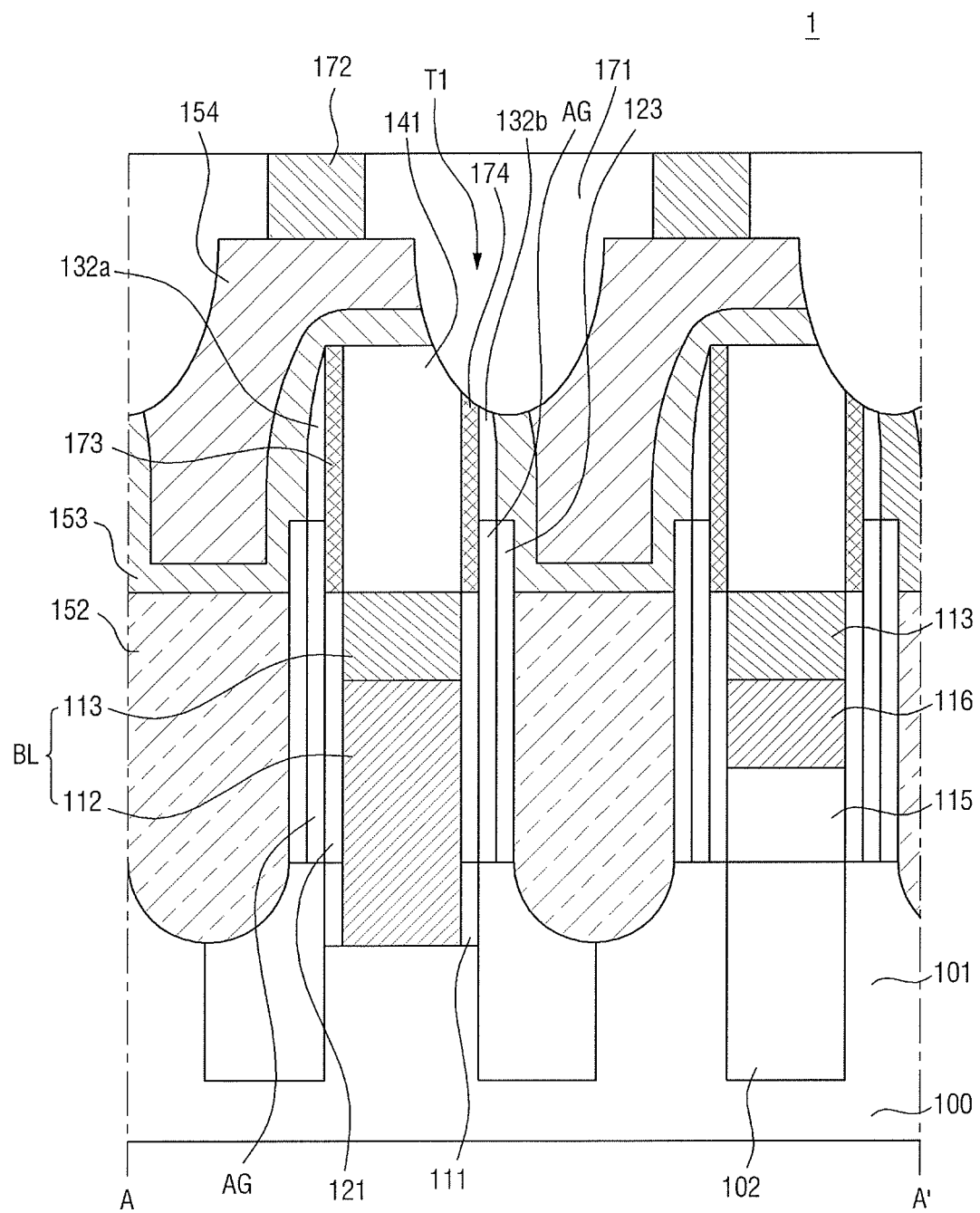
FIG. 2 illustrates a cross-sectional view taken along the line A-A' of FIG. 1.

FIG. 1 illustrates a top view of a semiconductor device 1 according to an embodiment. FIG. 2 illustrates a cross-sectional view taken along the line A-A' of FIG. 1.

Referring to FIGS. 1 and 2, the semiconductor device 1 according to the current embodiment may be formed in the form of a buried channel array transistor (BCAT) in active region 101.

A semiconductor substrate 100 may have, for example, a stacked structure of a base substrate and an epitaxial layer. The semiconductor substrate 100 may be a silicon substrate, a gallium arsenide substrate, a silicon germanium substrate, a ceramic substrate, a quartz substrate, a glass substrate for displays, or a silicon-on-insulator (SOI) substrate. In semiconductor devices according to embodiments, the silicon substrate will hereinafter be described as an example of the substrate 100.

A shallow trench isolation (STI) layer 102 may be formed in the semiconductor substrate 100 to define the active regions 101. Each of the active regions 101 may have an isolated shape and extend in a first direction DR1 when seen from above.

A word line WL may traverse the active regions 101. A bit line BL may extend along a second direction DR2 which forms an acute angle with the first direction DR1, and the word line WL may extend along a third direction DR3. In other words, the first direction and the third direction are not orthogonal to one another.

When "a specific direction forms a specific angle with another specific direction," the specific angle may be a smaller one of two angles formed by the intersection of the two directions. For example, when angles formed by the intersection of two directions are 114 degrees and 60 degrees, the specific angle may be 60 degrees. As illustrated in FIG. 1, an angle formed by the first direction DR1 and the second direction DR2 may be θ1, and an angle formed by the first direction DR1 and the third direction DR3 may be θ2.

As described above, θ1 and/or θ2 may be formed as an acute angle in order to secure a maximum gap between a bit line contact 160 which may connect each of the active regions 101 to the bit line BL and a storage node contact 155 which may connect each of the active regions 101 to a capacitor. For example, θ1 and θ2 may be 45 degrees and 45 degrees, 30 degrees and 60 degrees, or 60 degrees and 30 degrees, respectively.

The bit line BL may include a conductive pattern 113 and a bit line contact plug 112. The conductive pattern 113 may contain a conductive material, for example, one or more of polycrystalline silicon, a metal silicide compound, conductive metal nitride, or a metal.

The bit line contact plug 112 may contain a doped semiconductor material, conductive metal nitride, a metal, or a metal-semiconductor compound. The bit line contact plug 112 may electrically connect the conductive pattern 113 to an active region 101.

The bit line BL including a conductive pattern 113 and a bit line contact plug 112 may be formed and connected to an active region 102. An interlayer insulating film 115 may be formed under a conductive pattern 113 and a polysilicon layer 116, which may not be connected to a bit line contact plug 112, to insulate the conductive pattern 113 from an active region 102.

A bit line spacer 121 may be formed on both sidewalls of the bit line BL. The bit line spacer 121 may be between the bit line BL and a contact plug 152 to electrically insulate the bit line BL from the contact plug 152. The bit line spacer 121 may be disposed on a side surface of an air gap spacer AG to define the side surface of the air gap spacer AG. The bit line spacer 121 may contain, for example, silicon nitride (SiN) or silicon oxycarbonitride (SiOCN).

A bit line insulating layer 141 may be located on an upper surface of the bit line BL to electrically insulate the bit line BL from a landing pad 154 and a barrier metal 153. The bit line insulating layer 141 may include one or more of a silicon oxide layer, a silicon nitride layer, or a silicon oxynitride layer.

First and second partial layers 173 and 174 may be disposed on both sides of the bit line BL and the bit line insulating layer 141. The first partial layer 173 may contact part of a side surface of the air gap spacer AG to define the side surface of the air gap spacer AG.

The first and second partial layers 173 and 174 may contain silicon nitride. A space in which each of the first and second partial layers 173 and 174 is to be formed may be defined by etching and removing an oxide spacer 131 (see FIG. 14I) as will be described later, and silicon oxide may remain on the inside of sidewalls of each of the first and second partial layers 173 and 174.

Lowest parts of the first and second partial layers 173 and 174 may be lower than a highest part of the air gap spacer AG. Each of the first and second partial layers 173 and 174 may contact and horizontally overlap the air gap spacer AG.

The first partial layer 173 may vertically overlap the landing pad 154. The second partial layer 174 may be disposed on an opposite side of the bit line insulating layer 141 from the first partial layer 173 and may not vertically overlap the landing pad 154.

When a trench T1 is formed by etching the landing pad 154, the oxide spacer 131 (see FIG. 14I) may be partially etched, and a trench 162 (see FIG. 14J) may be formed. As will be described later, due to, for example, the shape of the trench 162 (see FIG. 14J), the second partial layer 174, unlike the first partial layer 173, may be shaped as if its upper part were partially etched.

This difference in shape between the first and second partial layers 173 and 174 may depend on whether the oxide spacer 131 (see FIG. 14I) is etched and exposed in the process of forming each of the first and second partial layers 173 and 174. This will be described in detail later.

The air gap spacer AG may be formed between the bit line BL and the contact plug 152. The air gap spacer AG may be an opening surrounded and defined by an insulating layer and may have a lower dielectric constant than silicon oxide, i.e., may be filled with a low-k dielectric, e.g., air. The air gap spacer AG may prevent capacitive coupling between the contact plug 152 and the bit line BL and reduce parasitic capacitance. As the parasitic capacitance between the contact plug 152 and the bit line BL is reduced, the operational stability of the semiconductor device 1 may be increased.

As the design rules of semiconductor devices used in dynamic random access memories (DRAMs) are reduced, an upper part of a bit line contact may need to be enlarged in order to increase a connection margin between the bit line contact and a landing pad. However, a passage for extracting silicon oxide that may fill a space in which an air gap spacer is to be formed may not be formed.

In the semiconductor device according to the present embodiment, a passage for extracting silicon oxide contained in a space in which the air gap spacer AG is to be formed may be formed through an oxide spacer 131 (see FIG. 14I) which may contact the air gap spacer AG. When the trench T1 is formed, part of the oxide spacer 131 (see FIG. 14J) may be etched, and the passage for extracting silicon oxide contained in the air gap spacer AG may be formed.

In the process of fabricating a semiconductor device according to embodiments, an upper part of a bit line contact may be enlarged to increase the connection margin between the bit line contact and a landing pad. The air gap spacers AG may be formed on both sides of the bit line BL to reduce parasitic capacitance between the bit line BL and the contact plug 152, which may increase the operational stability of the semiconductor device 1 including the air gap spacer AG.

An interlayer insulating film 171 may fill the trench T1. In some embodiments, the bit line insulating layer 141, the interlayer insulating film 171 and the first partial layer 174 may function as a blocking insulating layer which may prevent the air gap spacer AG from being exposed. The blocking insulating layer may define a region in which the air gap spacer AG may be formed in the semiconductor device 1.

The landing pad 154 may be formed on the contact plug 152 and electrically connect a separate data storage device, which may be connected to an upper part of the semiconductor device 1, and the semiconductor device 1. The landing pad 154 may vertically overlap each of the first and second partial layers 173 and 174 or the air gap spacer AG.

The contact plug 152 may be connected to each active region 102. The contact plug 152 may contain a doped semiconductor material, conductive metal nitride, a metal, or a metal-semiconductor compound.

The barrier metal 153 may be conformally formed on the contact plug 152 along the inside of sidewalls of a space in which the landing pad 154 is to be formed. The barrier metal 153 may contain, for example, cobalt silicide ($CoSi_x$), nickel silicide ($NiSi_x$), and manganese silicide ($MnSi_x$). In some embodiments, the barrier metal 153 may contain cobalt silicide.

A contact plug spacer 123 may be formed on sidewalls of the contact plug 152 and define one sidewall of the air gap spacer AG.

An air gap capping layer 132a may be formed between each of the first and second partial layers 173 and 174 and the barrier metal 153. The air gap capping layer 132a, 132b may be formed on an upper surface of the air gap spacer AG to define the upper surface of the air gap spacer AG.

Figure 3:
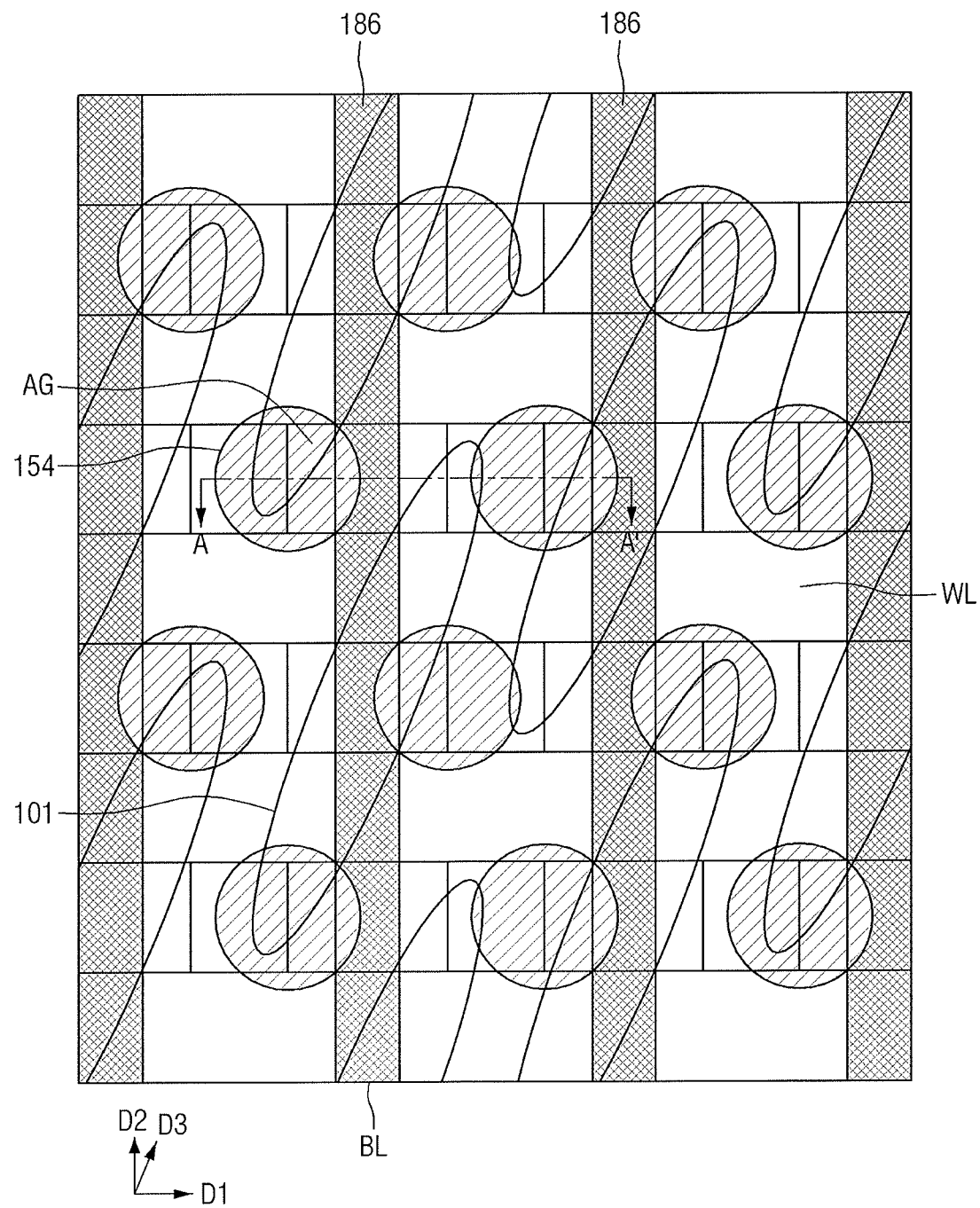
FIG. 3 illustrates a top view of a semiconductor device according to an embodiment.
Figure 4:
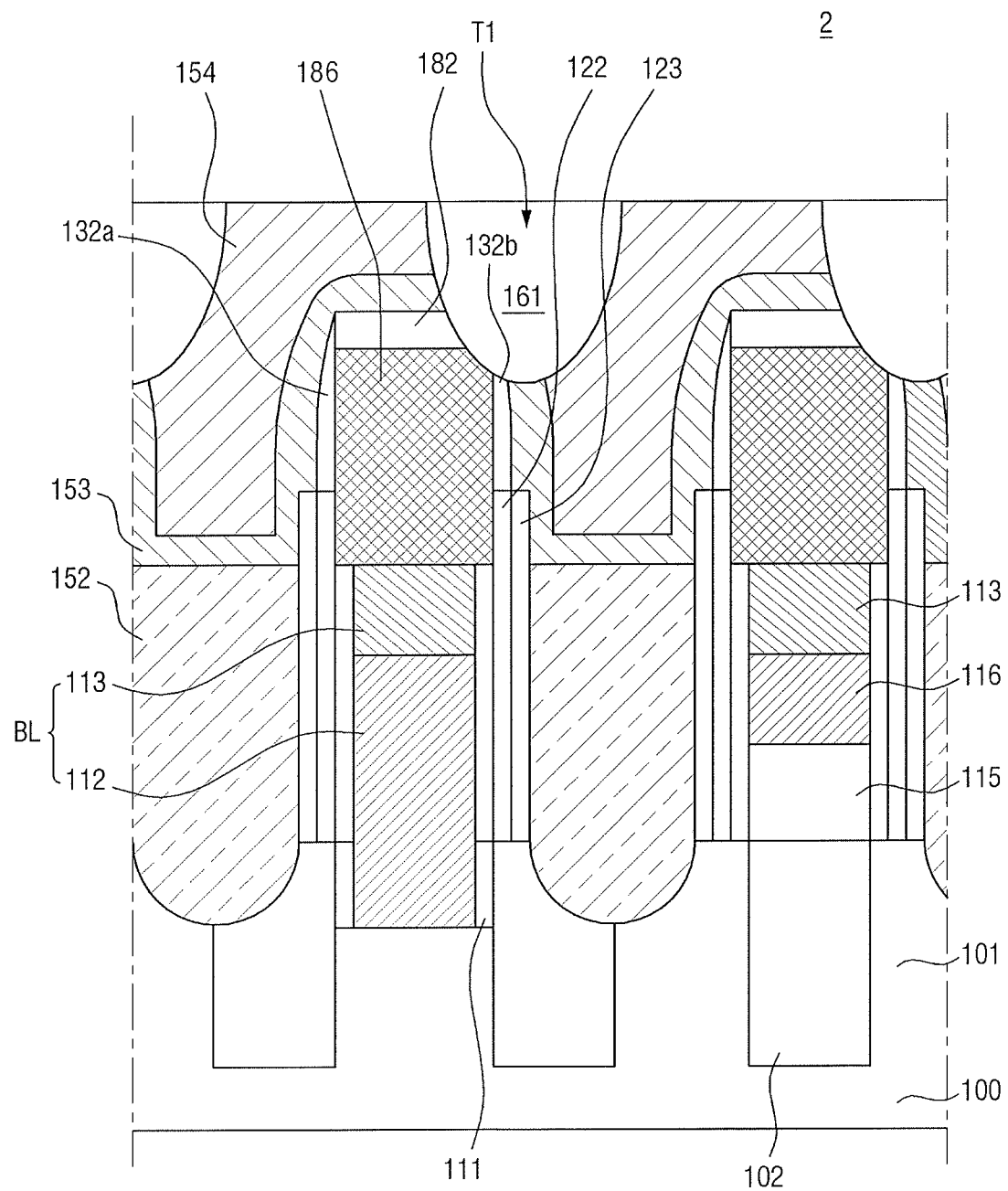
FIG. 4 illustrates a cross-sectional view taken along the line A-A' of FIG. 3.

FIG. 3 illustrates a top view of a semiconductor device 2 according to an embodiment. FIG. 4 illustrates a cross-sectional view taken along the line A-A' of FIG. 3.

A partial layer 186 of the semiconductor device 2 according to the current embodiment may be different in shape from the partial layer 174 according to the previous embodiment.

The partial layer 186 may be formed by filling a location, at which the partial layer 186 and an air gap spacer AG maybe formed, with oxide, removing the oxide using wet etching, and filling the location with an insulating material, and the partial layer 186 may cover the entire bit line BL. The partial layer 186 may be connected to the air gap spacer AG on both sides of the bit line BL.

Figure 5:
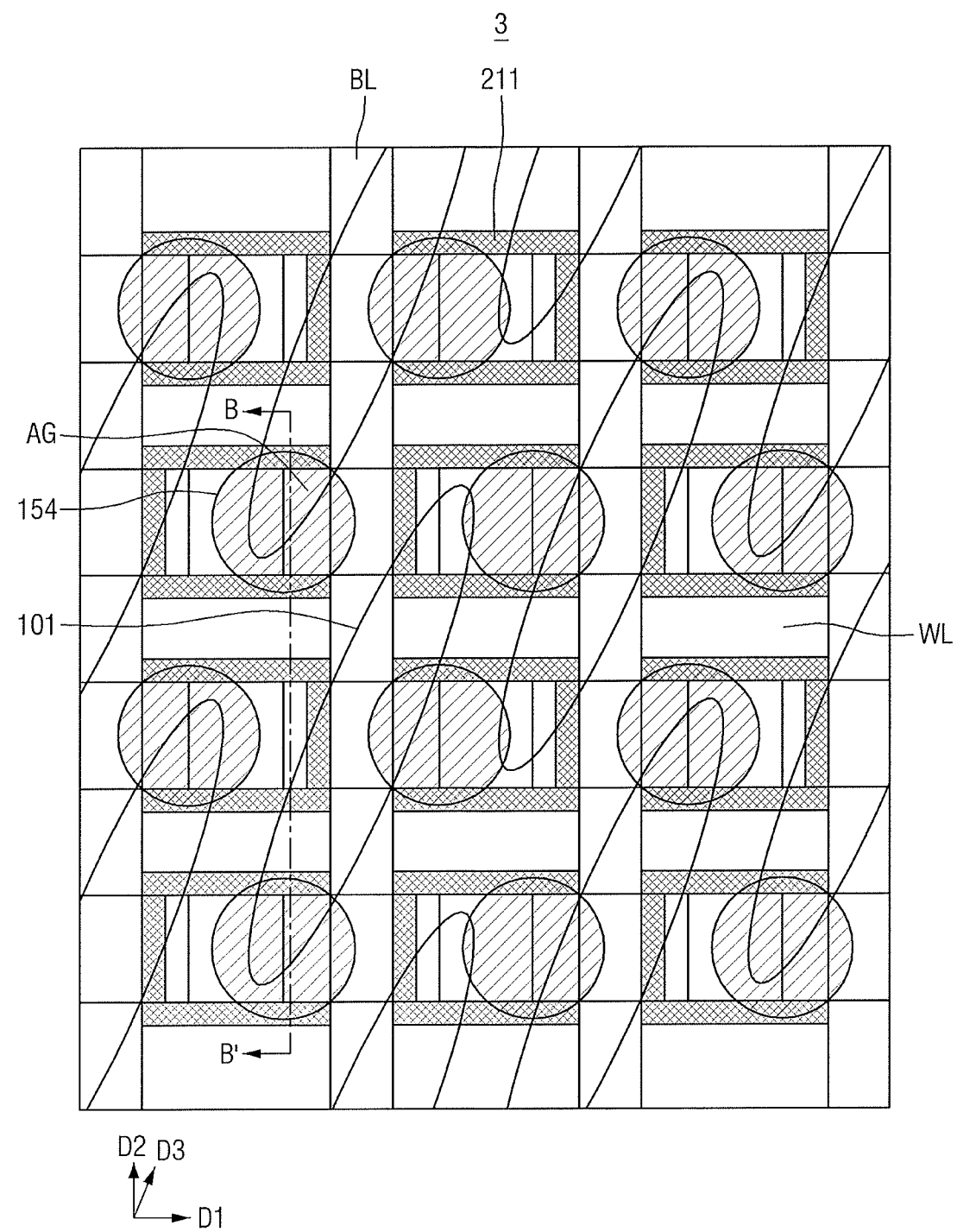
FIG. 5 illustrates a top view of a semiconductor device according to an embodiment.
Figure 6:
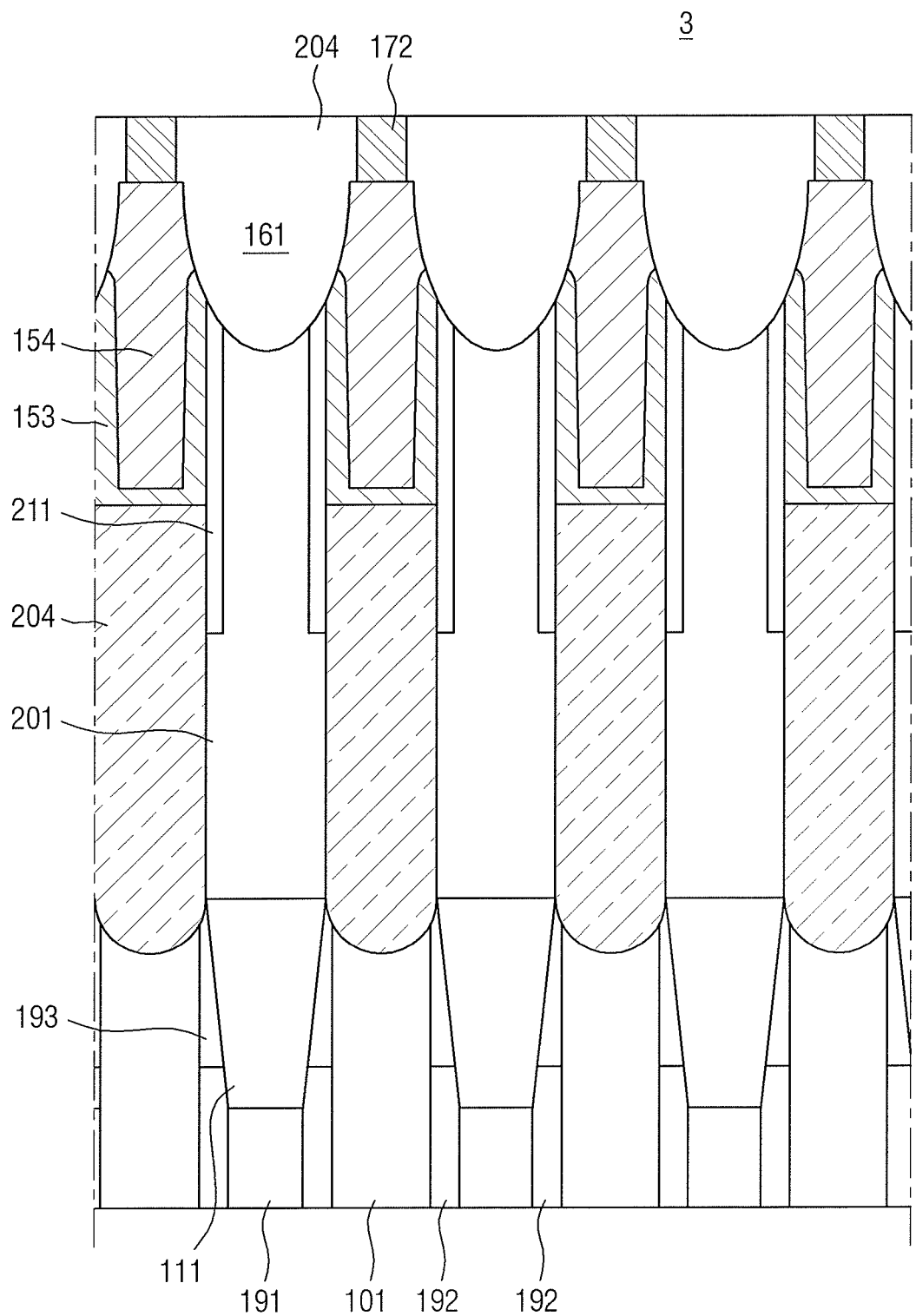
FIG. 6 illustrates a cross-sectional view taken along the line B-B' of FIG. 5.

FIG. 5 illustrates a top view of a semiconductor device 3 according to an embodiment. FIG. 6 illustrates a cross-sectional view taken along the line B-B' of FIG. 5.

A partial layer 211 of the semiconductor device 3 according to the current embodiment may be different in shape from those of the previous embodiments.

The partial layer 211 may include parts formed on both sidewalls of an intermediate insulating layer 201, which may be adjacent to contact plugs 204, to face each other. The partial layer 211 may be connected to an air gap spacer AG formed on both sides of a bit line BL and used as a passage for removing oxide that may fill the air gap spacer AG.

Figure 7:
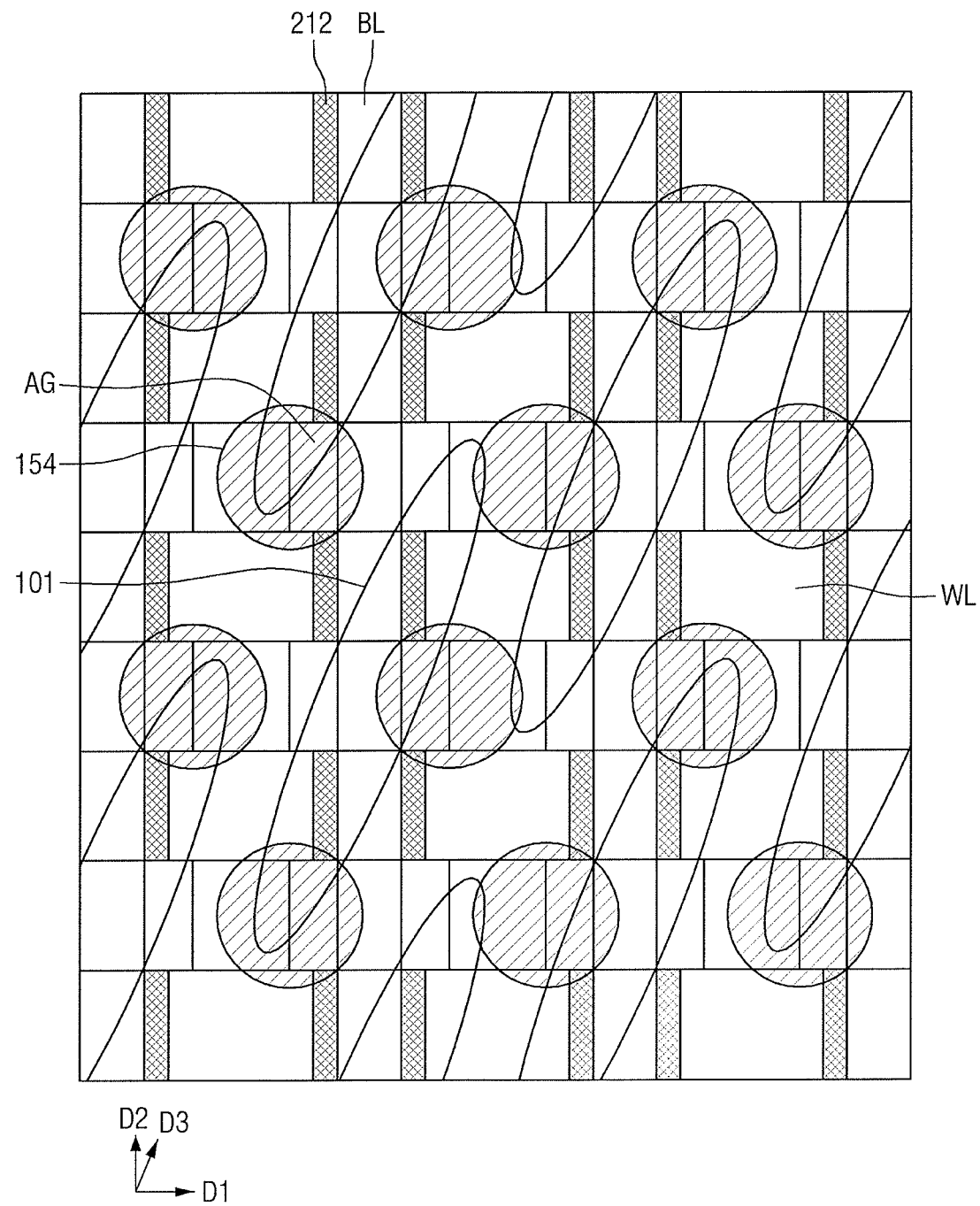
FIGS. 7 and 8 illustrate top views of semiconductor devices according to embodiments.
Figure 8:
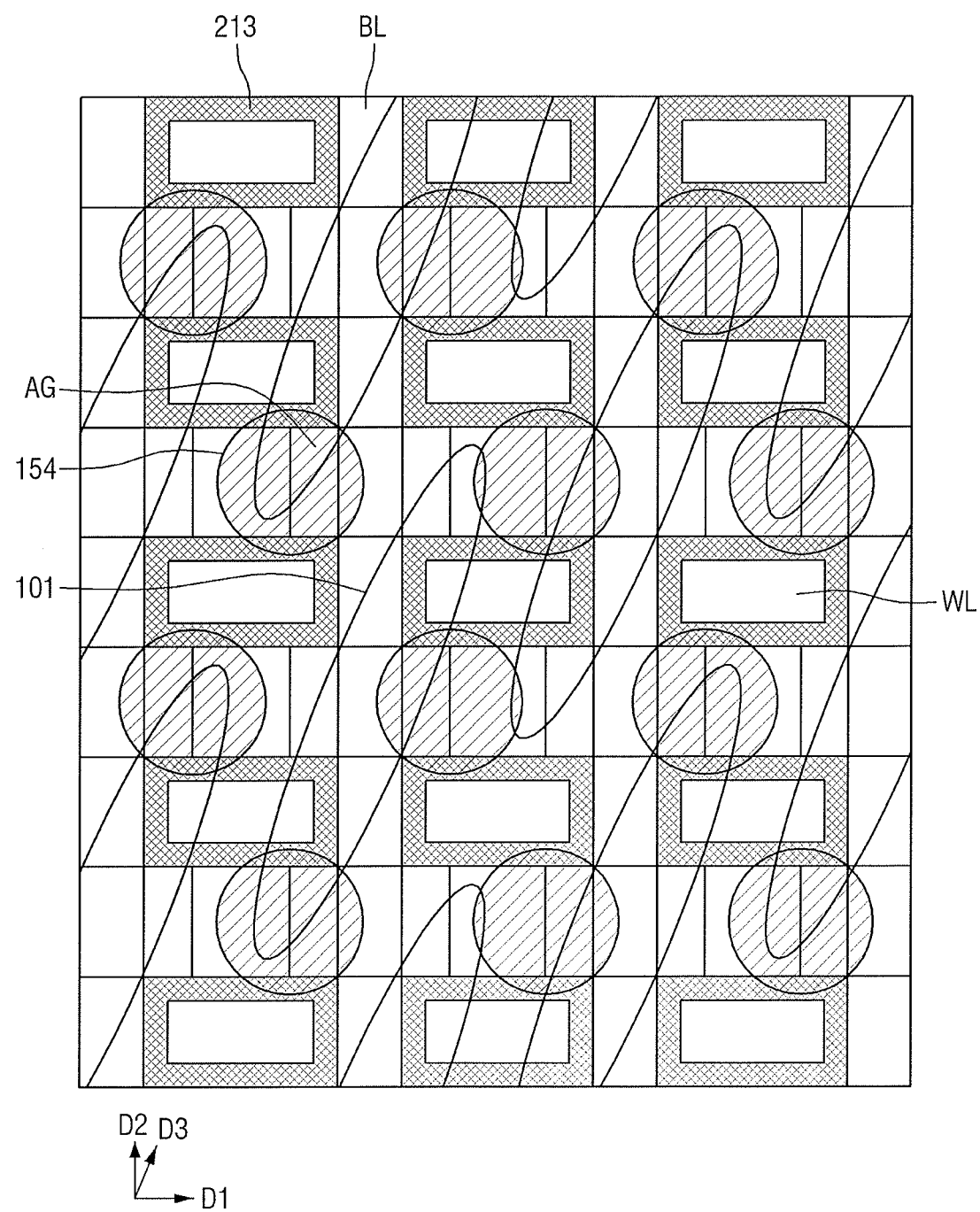

FIGS. 7 and 8 illustrate top views of semiconductor devices 4 and 5 according to embodiments.

Referring to FIG. 7, a partial layer 212 may connect sidewalls of an air gap spacer AG. The partial layer 212 may be formed on both sidewalls of an intermediate insulating layer 201 between contact plugs 152 to connect the air gap spacers AG.

Since the partial layer 212 is not vertically overlapped by a landing pad 154, it may be used as a passage for removing oxide that may fill the air gap spacer AG.

Referring to FIG. 8, a partial layer 213 may surround sidewalls of an intermediate insulating layer 201. Since the partial layer 213 is not vertically overlapped by a landing pad 154, it may be connected to an air gap spacer AG and used as a passage for removing oxide that may fill the air gap spacer AG.

Figure 9:
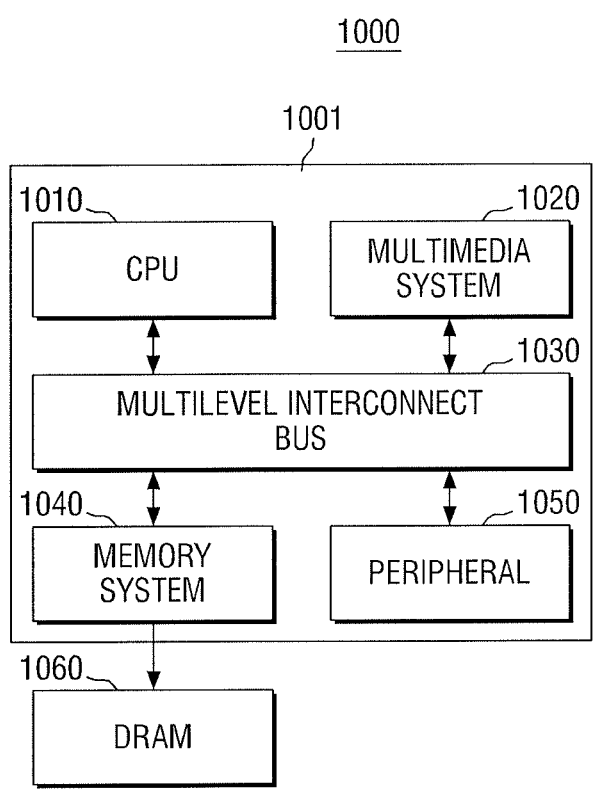
FIG. 9 illustrates a block diagram of a system-on-chip (SoC) system including semiconductor devices according to embodiments.

FIG. 9 illustrates a block diagram of a system-on-chip (SoC) system 1000 including semiconductor devices according to embodiments.

Referring to FIG. 9, the SoC system 1000 includes an application processor 1001 and a DRAM 1060.

The application processor 1001 may include a central processing unit (CPU) 1010, a multimedia system 1020, a multilevel interconnect bus 1030, a memory system 1040, and a peripheral circuit 1050.

The CPU 1010 may perform operations that may be needed to drive the SoC system 1000. In some embodiments, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The multilevel interconnect bus 1030 may be used for data communication among the CPU 1010, the multimedia system 1020, the memory system 1040 and the peripheral circuit 1050. In some embodiments, the multilevel interconnect bus 1030 may have a multilayer structure. For example, the multilevel interconnect bus 1030 may be a multilayer advanced high-performance bus (AHB) or a multilayer advanced extensible interface (AXI).

The memory system 1040 may provide an environment that may be needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment that may be needed for the SoC system 1000 to smoothly connect to an external device (e.g., mainboard). The peripheral circuit 1050 may include various interfaces that enable external devices connected to the SoC system 1000 to be compatible with the SoC system 1000.

The DRAM 1060 may function as a working memory that may be needed for the operation of the application processor 1001. In some embodiments, the DRAM 1060 may be placed outside the application processor 1001 as illustrated in the drawing. For example, the DRAM 1060 may be packaged with the application processor 1001 in the form of package on package (PoP).

At least one of the elements of the SoC system 1000 may employ one of the semiconductor devices according to the above-described embodiments.

Figure 10:
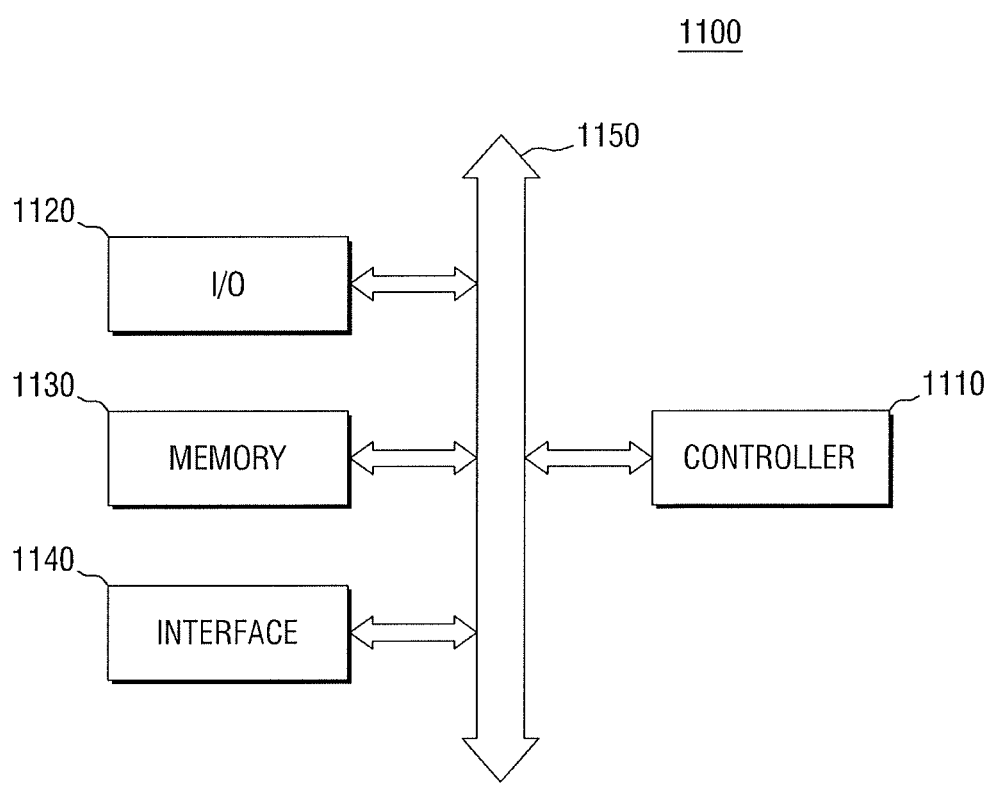
FIG. 10 illustrates a block diagram of an electronic system including semiconductor devices according to embodiments and a SoC system.

FIG. 10 illustrates a block diagram of an electronic system 1100 including semiconductor devices according to embodiments and a SoC system.

Referring to FIG. 10, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include one or more of a microprocessor, a digital signal processor, a microcontroller and logic devices that may be capable of performing similar functions to those of a microprocessor, a digital signal processor, or a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

The electronic system 1100 may further include a high-speed DRAM or static random access memory (SRAM) as a working memory for improving the operation of the controller 1110. One of the semiconductor devices according to the above-described embodiments may be employed as the working memory to improve the reliability of a product.

One of the semiconductor devices according to the above-described embodiments may be provided in the memory device 1130 or in the controller 1110 or the I/O device 1120.

The electronic system 1100 may be applied to nearly all types of electronic products that may be capable of transmitting and/or receiving information in a wireless environment, such as, for example, a personal data assistant (PDA), a portable computer, a web tablet, a wireless phone, a mobile phone, a digital music player, or a memory card.

Figure 11:
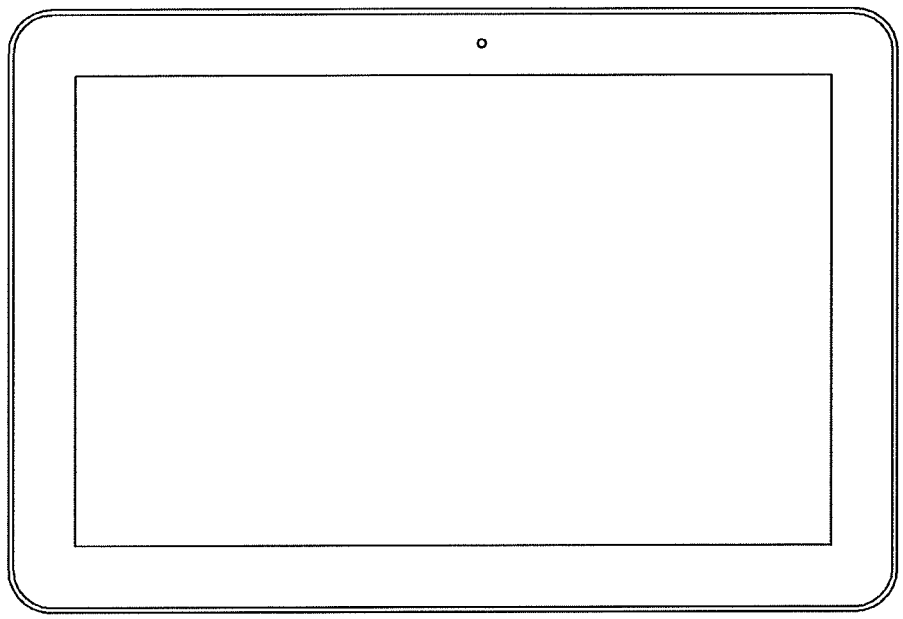
FIGS. 11 through 13 illustrate diagrams of examples of a semiconductor system to which semiconductor devices according to embodiments may be applied.
Figure 12:
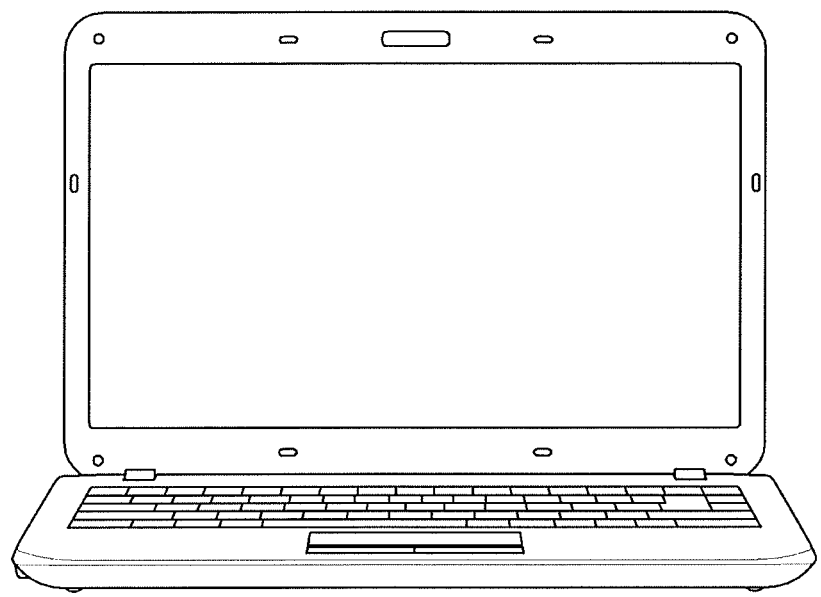
Figure 13:
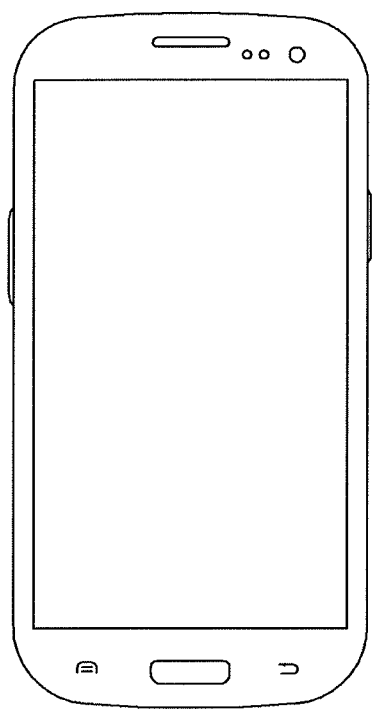

FIGS. 11 through 13 illustrate diagrams of examples of a semiconductor system to which semiconductor devices according to embodiments may be applied.

FIG. 11 illustrates a tablet personal computer (PC) 1200, FIG. 12 illustrates a notebook computer 1300, and FIG. 13 illustrates a smartphone 1400. At least one of the semiconductor devices according to the above-described embodiments, as set forth herein, may be used in the tablet PC 1200, the notebook computer 1300, and the smartphone 1400.

The semiconductor devices according to the embodiments, as set forth herein, may also be applied to various integrated circuit (IC) devices other than those set forth herein.

The tablet PC 1200, the notebook computer 1300, and the smartphone 1400 are examples of the semiconductor system according to the current embodiment.

In some embodiments, the semiconductor system may be provided as, for example, a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, or a digital video player.

FIGS. 14A through 14J illustrate views of stages in a method of fabricating a semiconductor device according to an embodiment.

Figure 14A:
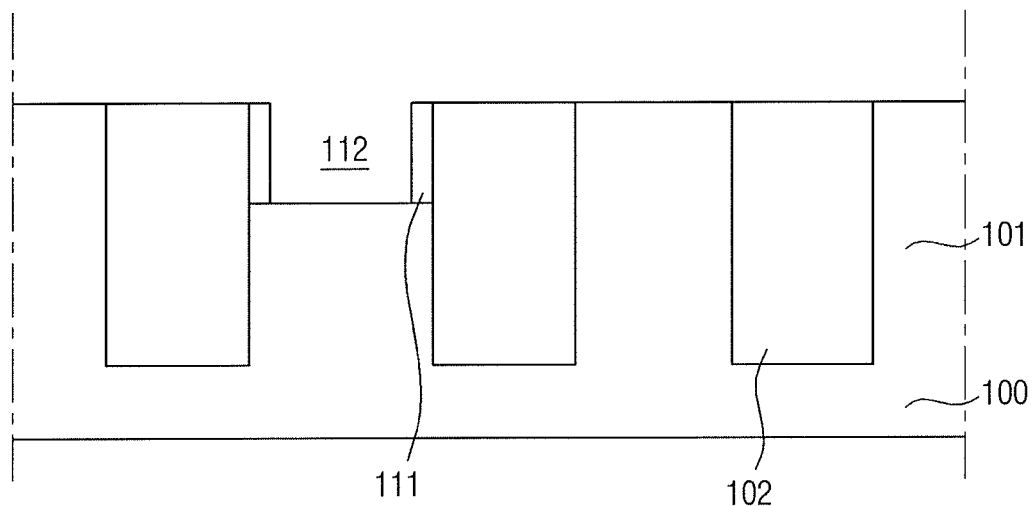
FIGS. 14A through 14J illustrate views of stages in a method of fabricating a semiconductor device according to an embodiment.

Referring to FIGS. 14A and 2, an STI layer 101 may be formed in a semiconductor substrate 100 to define active regions 102. Then, a trench may be formed in a region in which a bit line BL is to be formed, and a lower bit line spacer 111 may be formed.

Figure 14B:
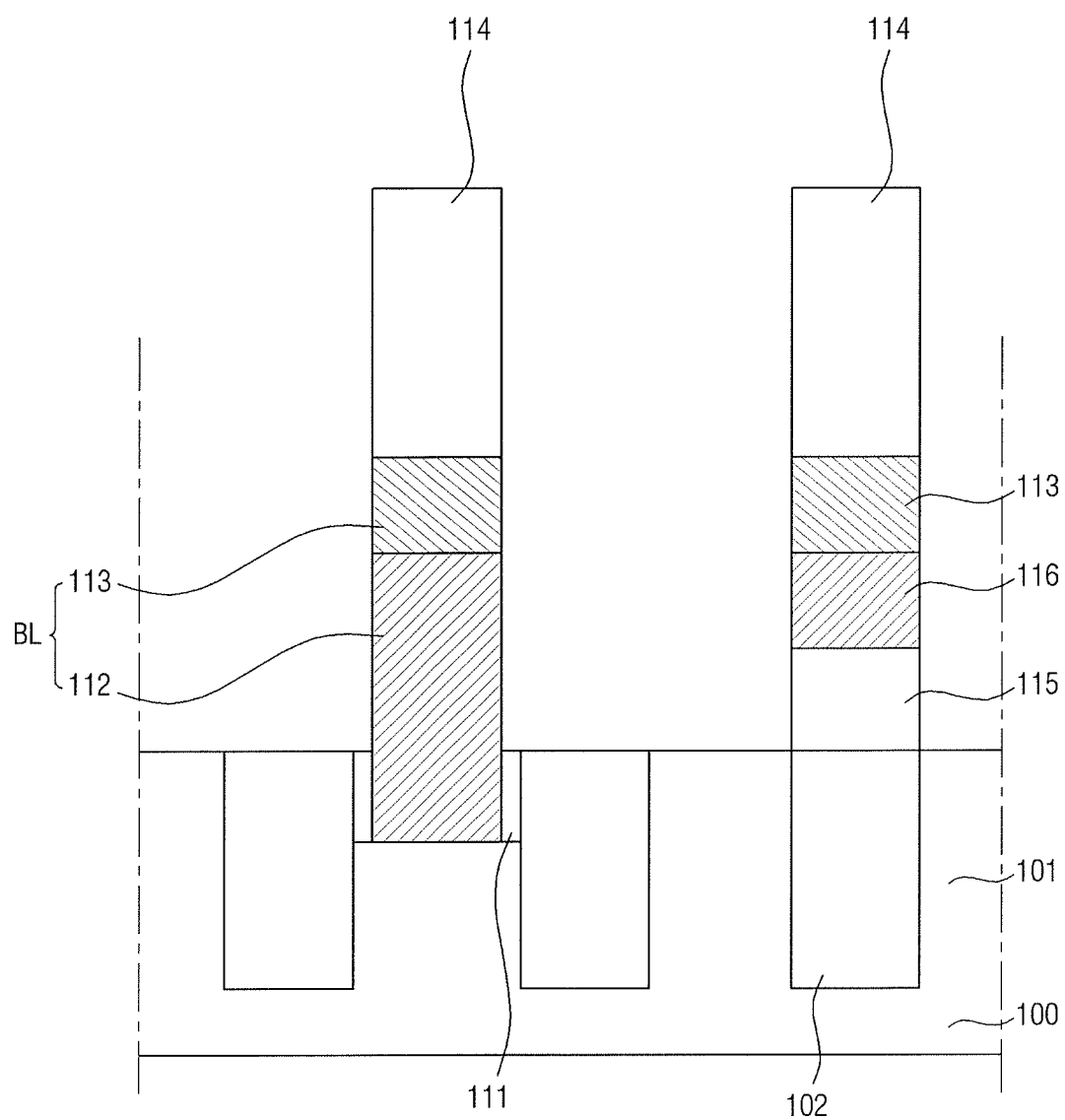

Referring to FIG. 14B, the bit line BL including a conductive pattern 113 and a bit line contact plug 112 may be formed and connected to an active region 102. An interlayer insulating film 115 may be formed under a conductive pattern 113 and a polysilicon layer 116, which may not be connected to a bit line contact plug 112, to insulate the conductive pattern 113 from an active region 102. Then, a sacrificial layer pattern 114 may be formed on each of the conductive patterns 113.

Figure 14C:
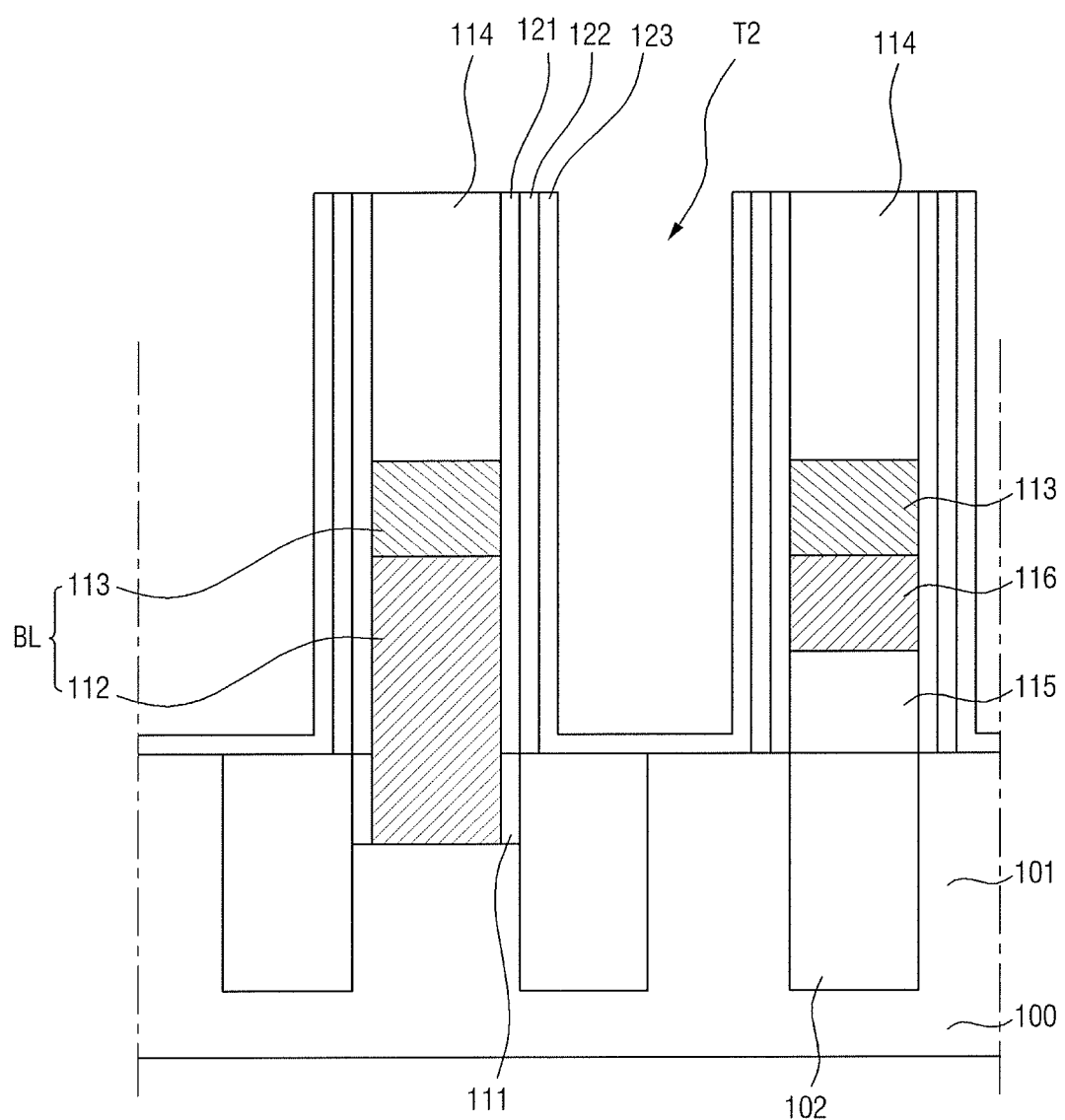

Referring to FIGS. 14C and 2, a bit line spacer 121, a first oxide spacer 122, and a contact plug spacer 123 may be formed sequentially on sidewalls of a trench T2 in which a contact plug 152 is to be formed.

The bit line spacer 121 and the first oxide spacer 122 may be conformally formed along the inside of sidewalls of the trench T2. Then, the bit line spacer 121 and the first oxide spacer 122 may be anisotropically etched to expose the STI layer 102 and the active region 101. The contact plug spacer 123 may be conformally formed along the inside of the sidewalls of the trench T2.

Figure 14D:
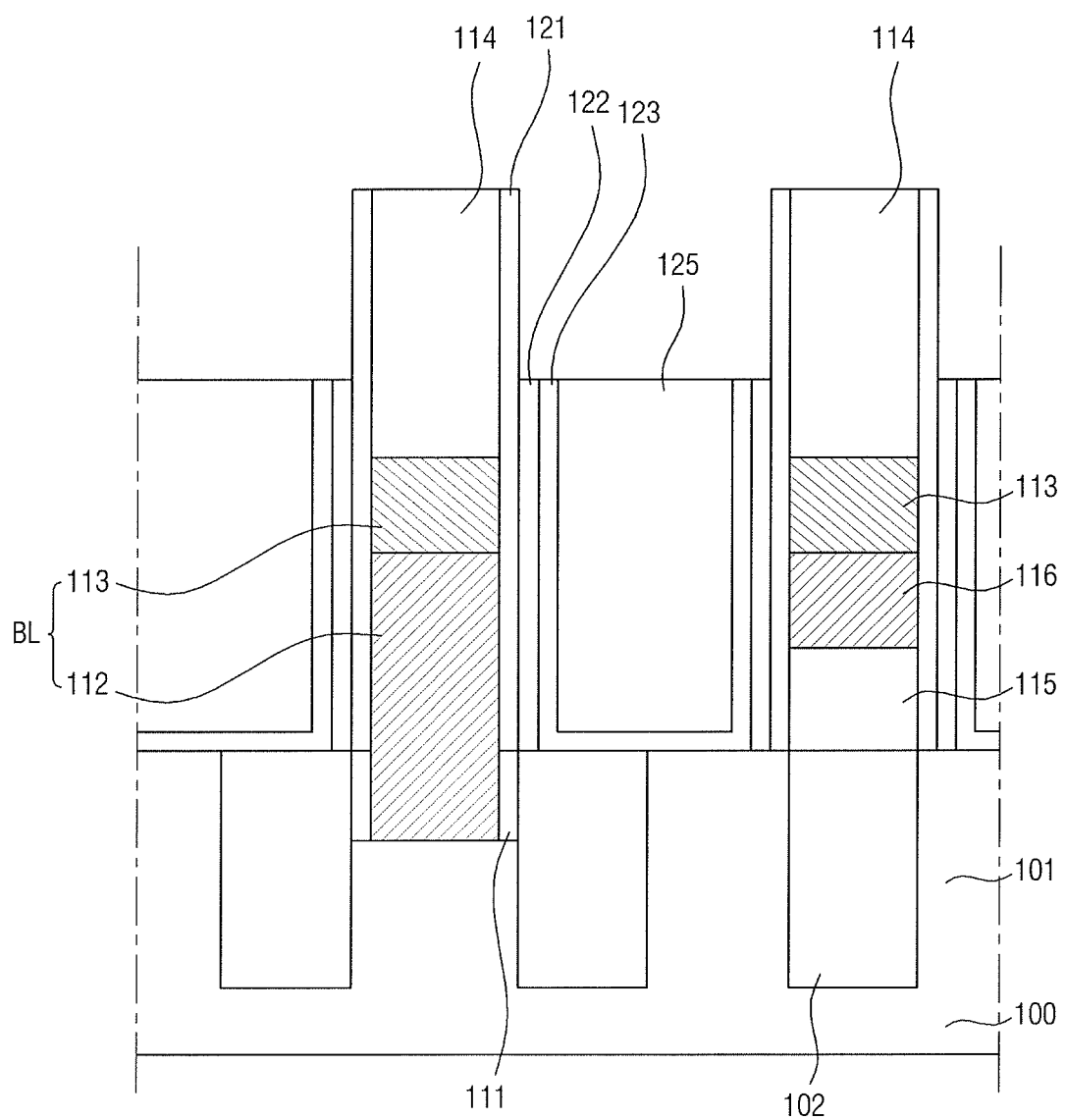

Referring to FIG. 14D, a hard mask 125 may be formed in the trench T2 and then etched back to a height illustrated in FIG. 14D. The hard mask 125 may be, for example, a spin-on-hard mask (SOH).

Next, the contact plug spacer 123 and the first oxide spacer 122 are wet-etched to the height of the hard mask 125.

Figure 14E:
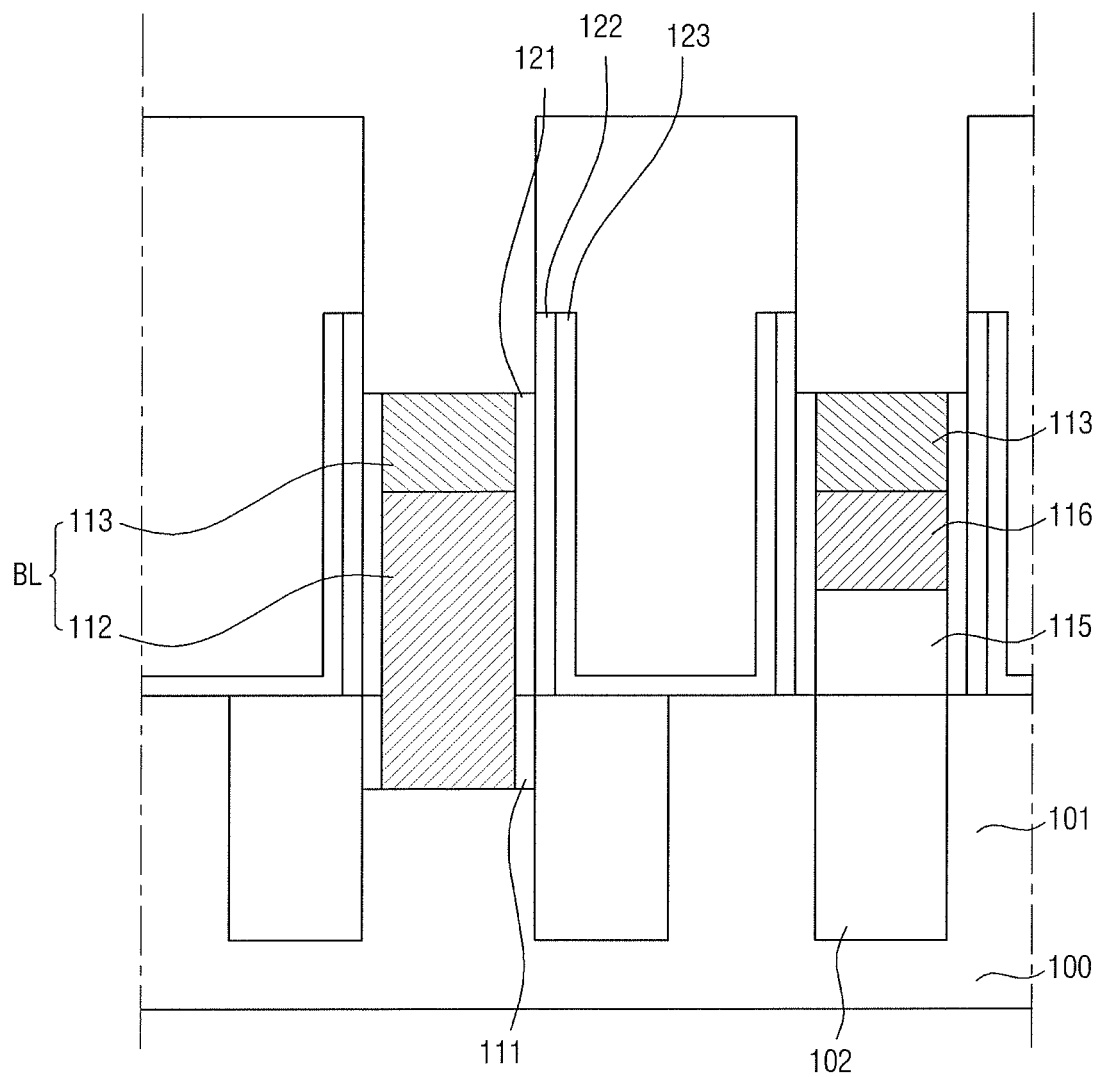

Referring to FIG. 14E, a hard mask 125a may be formed to the height of the sacrificial layer patterns 114, and the sacrificial layer patterns 114 and the bit line spacer 121 may be recessed to expose the conductive patterns 113.

Figure 14F:
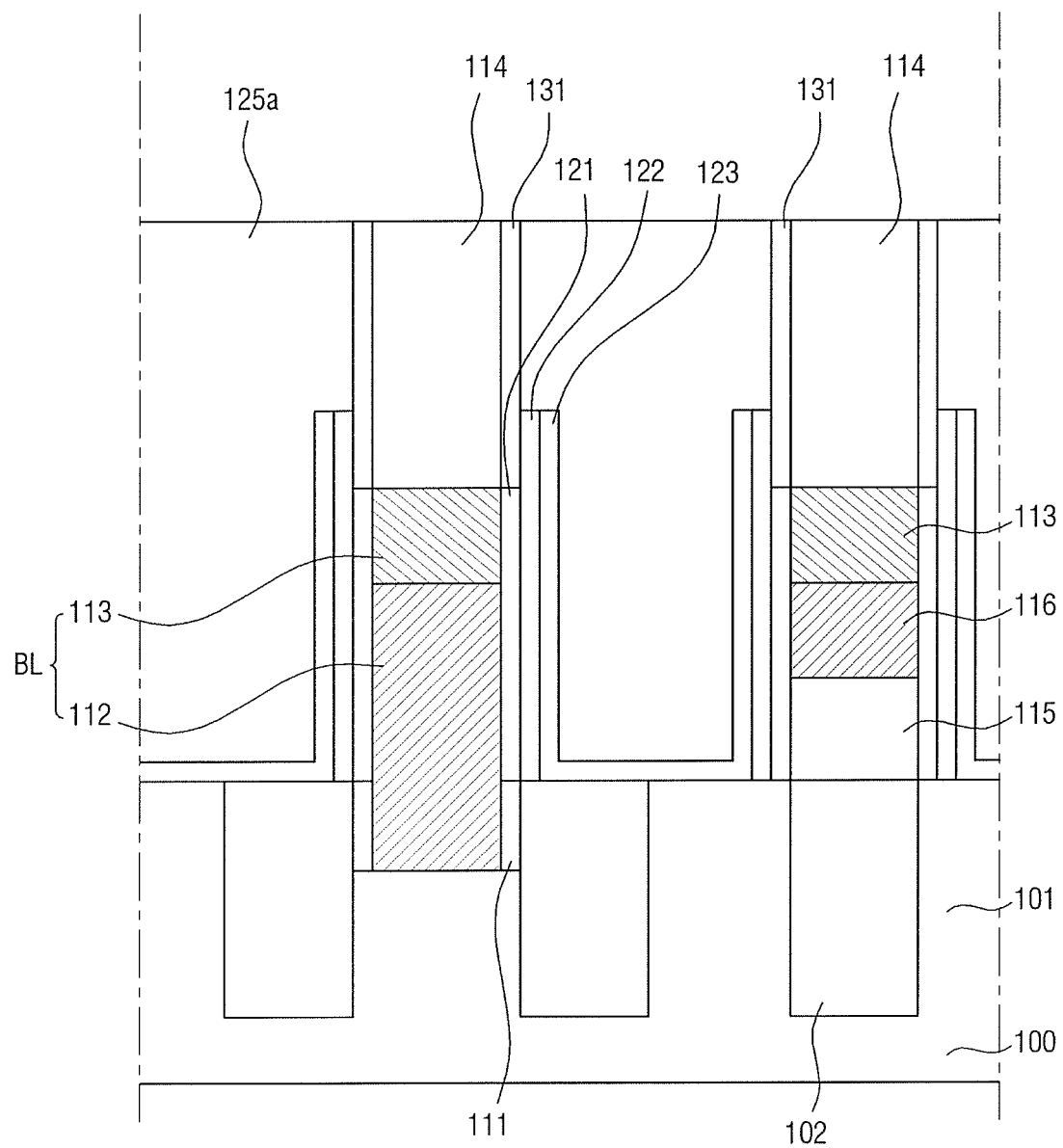

Referring to FIG. 14F, a second oxide spacer 131 may be formed on the inside of sidewalls of regions in which the sacrificial layer patterns 114 and the bit line spacer 121 may be recessed. Then, a bit line insulating layer 114 may be formed to the height of an upper surface of the hard mask 125a to fill a space between the hard mask 125a and another hard mask 125a.

Figure 14G:
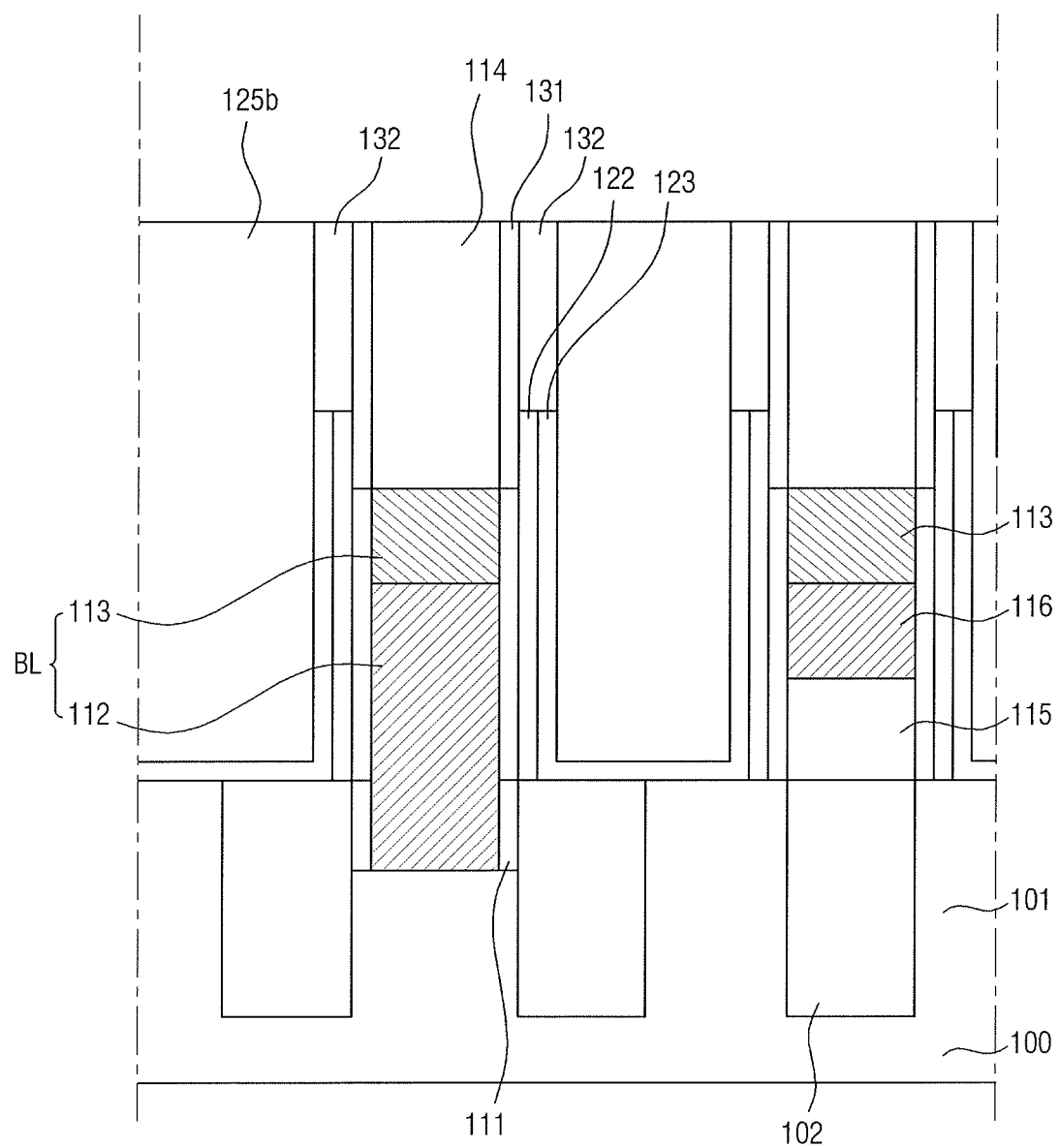

Referring to FIG. 14G, the hard mask 125a may be etched back to the height of upper surfaces of the first oxide spacer 122 and the contact plug spacer 123. Then, an air gap capping layer 132 may be formed. Next, a hard mask 125b may be formed by filling the hard mask 125a with an organic material. The organic material may be, for example, SOH.

Figure 14H:
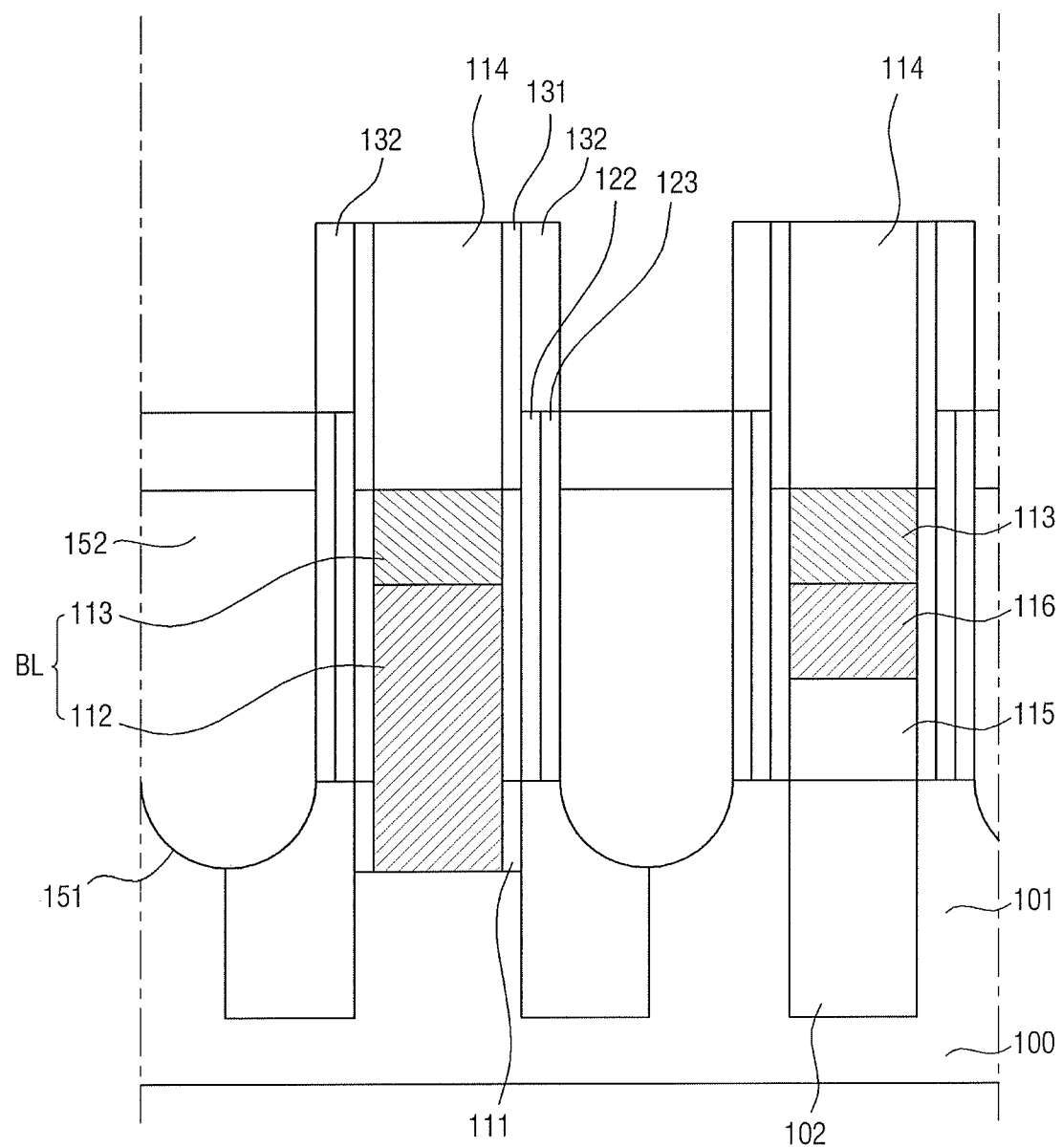

Referring to FIG. 14H, a contact hole 151 may be formed by etching the hard mask 125b, the contact plug spacer 123, the active region 101, and the STI layer 102. A lower surface of the contact hole 151 may contact the active region 101 such that a contact plug 152 may be electrically connected to the active region 101.

Next, the contact plug 152 may be formed by filling the contact hole 151 with a conductive material and then etched back to a predetermined height. The contact plug 152 may be formed by depositing, e.g., polysilicon.

Figure 14I:
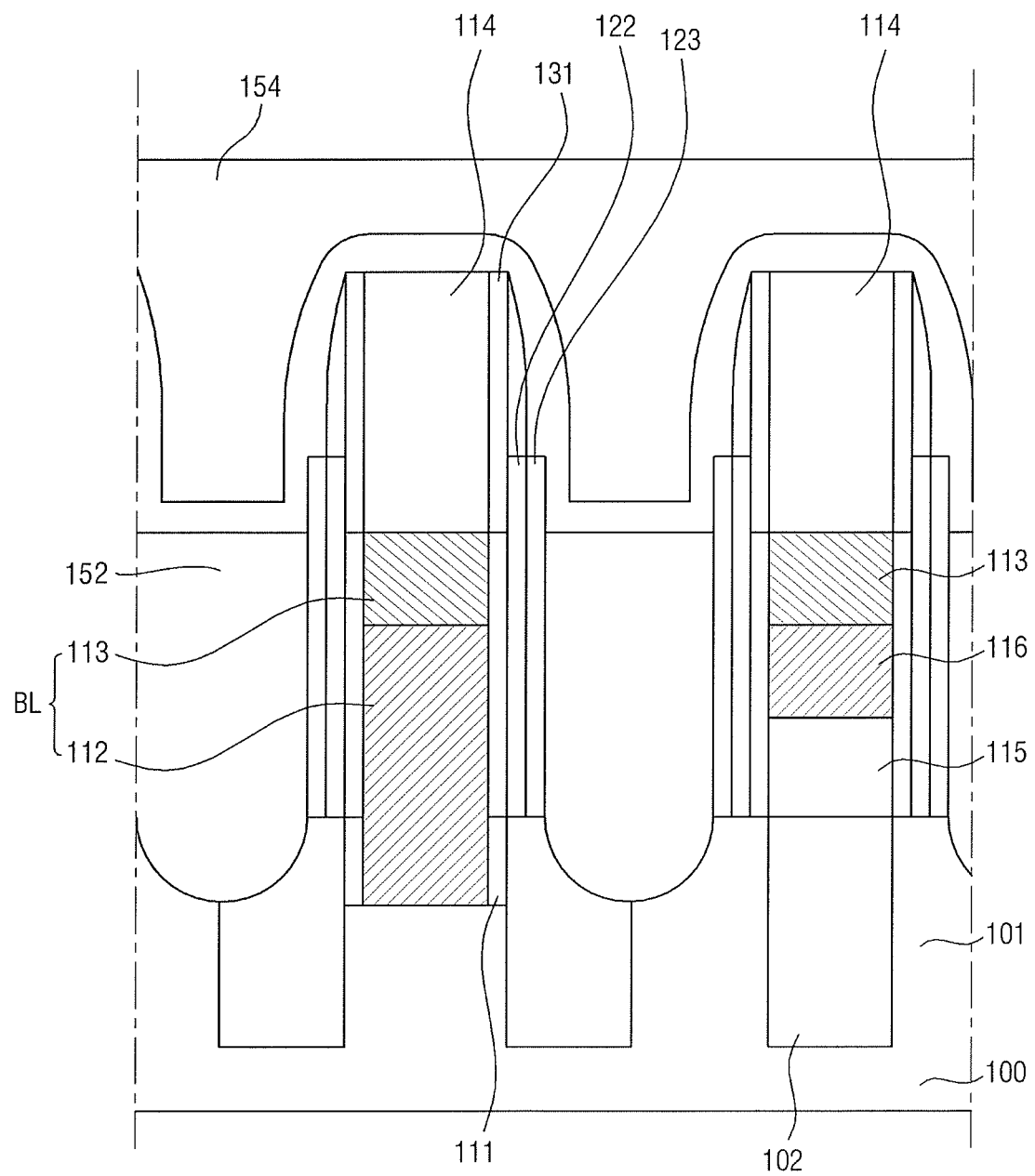

Referring to FIG. 14I, the contact plug 152 may be etched back again to a predetermined height, and part of the air gap capping layer 132 may be removed by enlarging an upper part of the contact hole 151.

As semiconductor devices used in DRAMs become miniaturized, a connection defect may occur between devices due to, for example, a small connection margin between a bit line contact and a landing pad. To prevent a connection defect, a contact area between a landing pad 154 and the contact plug 152 may be increased by enlarging the upper part of the contact hole 151.

Next, a barrier metal 153 may be conformally formed on the contact plug 152 and the bit line BL, and the landing pad 154 may be formed to cover the whole of the barrier metal 153. To form the barrier metal 153, a metal layer may be formed, and then silicide may be formed by making the contact plug 152 and the metal layer react with each other.

Figure 14J:
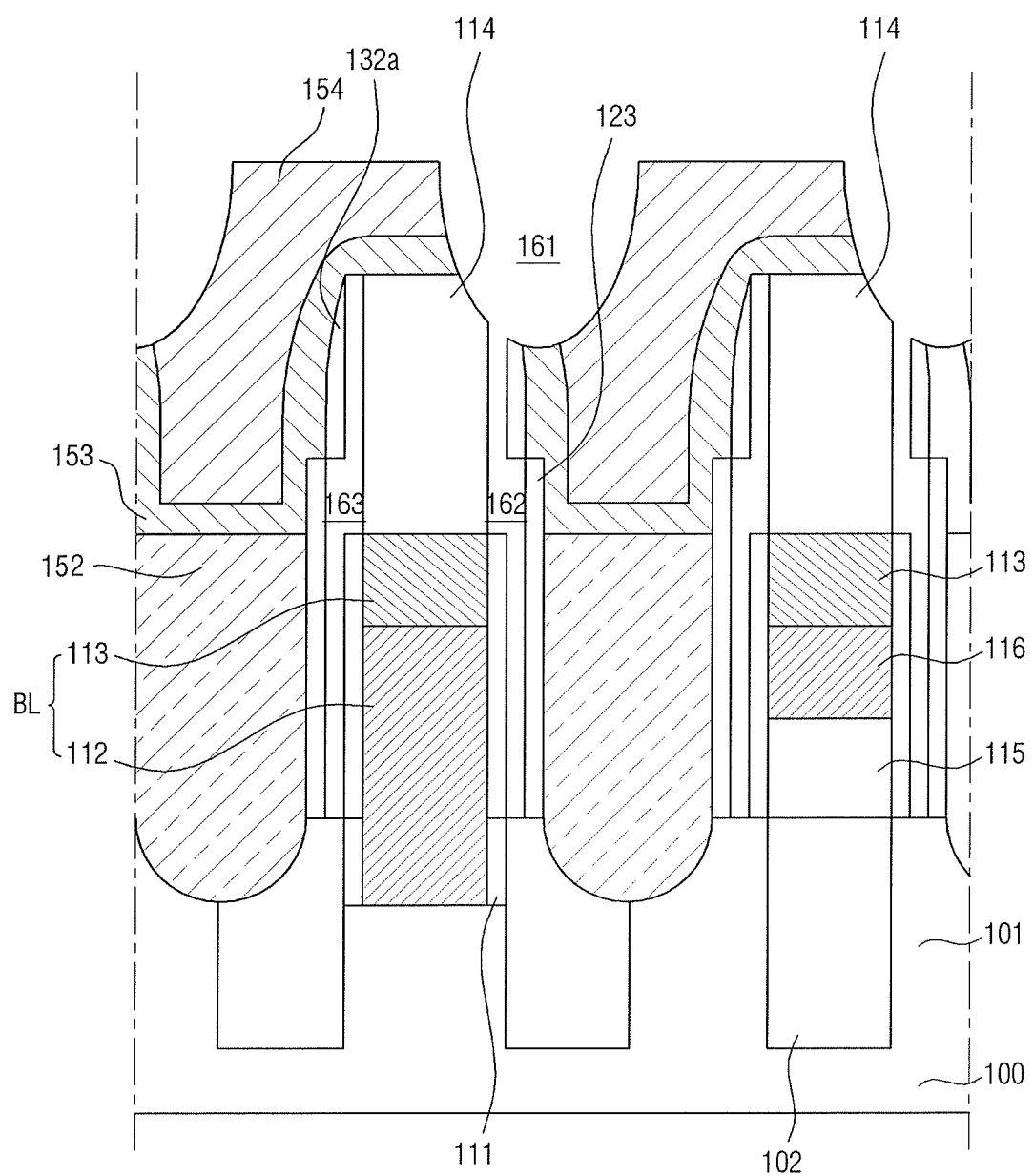

Referring to FIGS. 1, 2, and 14J, a trench 161 may be formed in the landing pad 154, and the second oxide spacer 131 exposed through the trench 161 may be etched. If the first oxide spacer 122 and the second oxide spacer 131 are the same silicon oxide, they may be etched simultaneously using the same etching method.

The first and second oxide spacers 122 and 131 may be wet-etched, for example, wet-etched using hydrofluoric acid (HF) or ammonium fluoride ($NH_4F$) as an etchant.

The upper surface of the first oxide spacer 122 in which an air gap spacer AG is to be formed may be lower than a lower surface of the trench 161 and may not be exposed through the trench 161. The first oxide spacer 122 may not be etched using an etchant, and it may be difficult to form the air gap spacer AG. In the method of fabricating a semiconductor device according to the current embodiment, the first and second oxide spacers 122 and 131 may be etched simultaneously through the upper surface of the second oxide spacer 122 exposed through the trench 161, and a trench 162 in which the air gap spacer AG is to be formed may be formed.

In the case of the first and second oxide spacers 122 and 131 vertically overlapped by the landing pad 154, a trench 163 may be formed by injecting an etchant into a rear side of the air gap spacer AG extending along the second direction D2.

Referring back to FIG. 2, the air gap spacer AG and partial layers 173 and 174 is to be formed by injecting an insulating material into the trenches 162 and 163, and the trench T1 (161 in FIG. 14J) may be filled with an interlayer insulating film 171.

A trench in which each of the partial layers 173 and 174 may be formed may be formed by wet-etching the second oxide spacer 123, and oxide may remain on the inside of sidewalls of each of the partial layers 173 and 174.

FIGS. 15A through 15E illustrate views of stages in a method of fabricating a semiconductor device according to an embodiment.

Figure 15A:
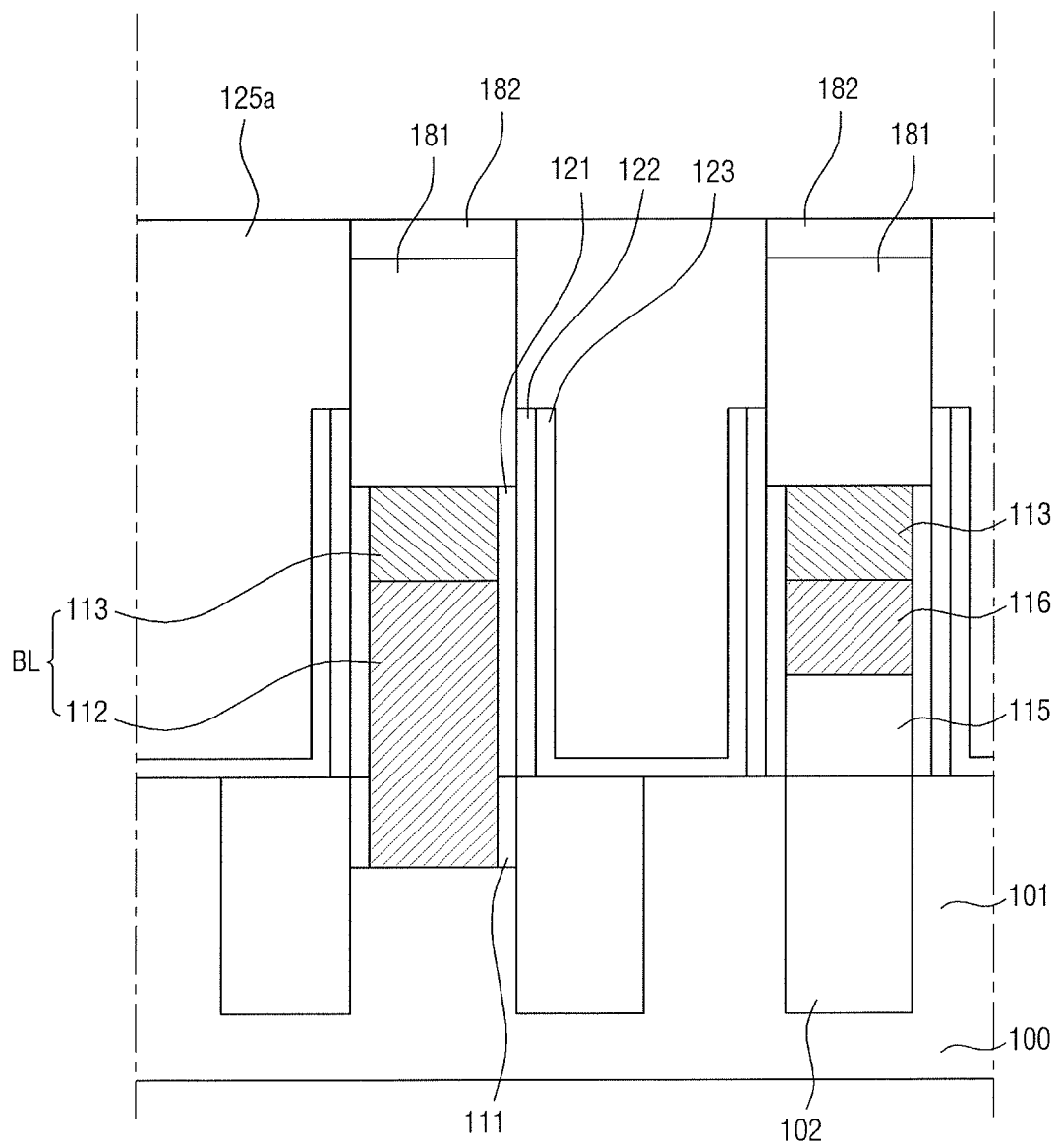
FIGS. 15A through 15E illustrate views of stages in a method of fabricating a semiconductor device according to an embodiment.

Referring to FIGS. 14D and 15A, a hard mask 125a may be formed by further depositing an organic material on a hard mask 125 and spacers 122 and 123. Then, an oxide layer 181 and an insulating layer 182 may be formed on a bit line BL. The method of fabricating a semiconductor device according to the current embodiment is different from the method of fabricating a semiconductor device according to the previous embodiment in that the oxide layer 181 may be formed to completely cover the bit line BL.

Figure 15B:
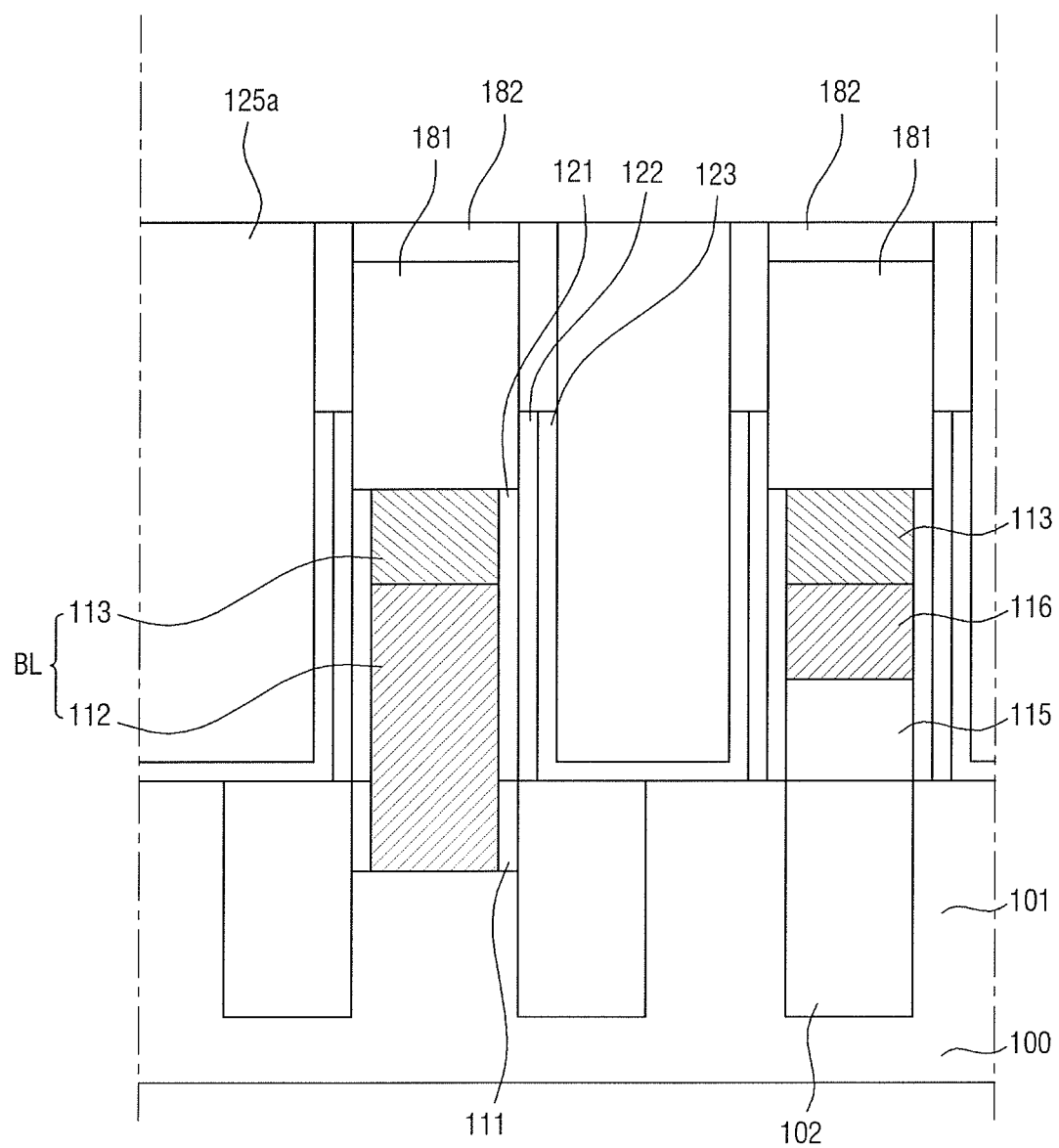
Figure 15C:
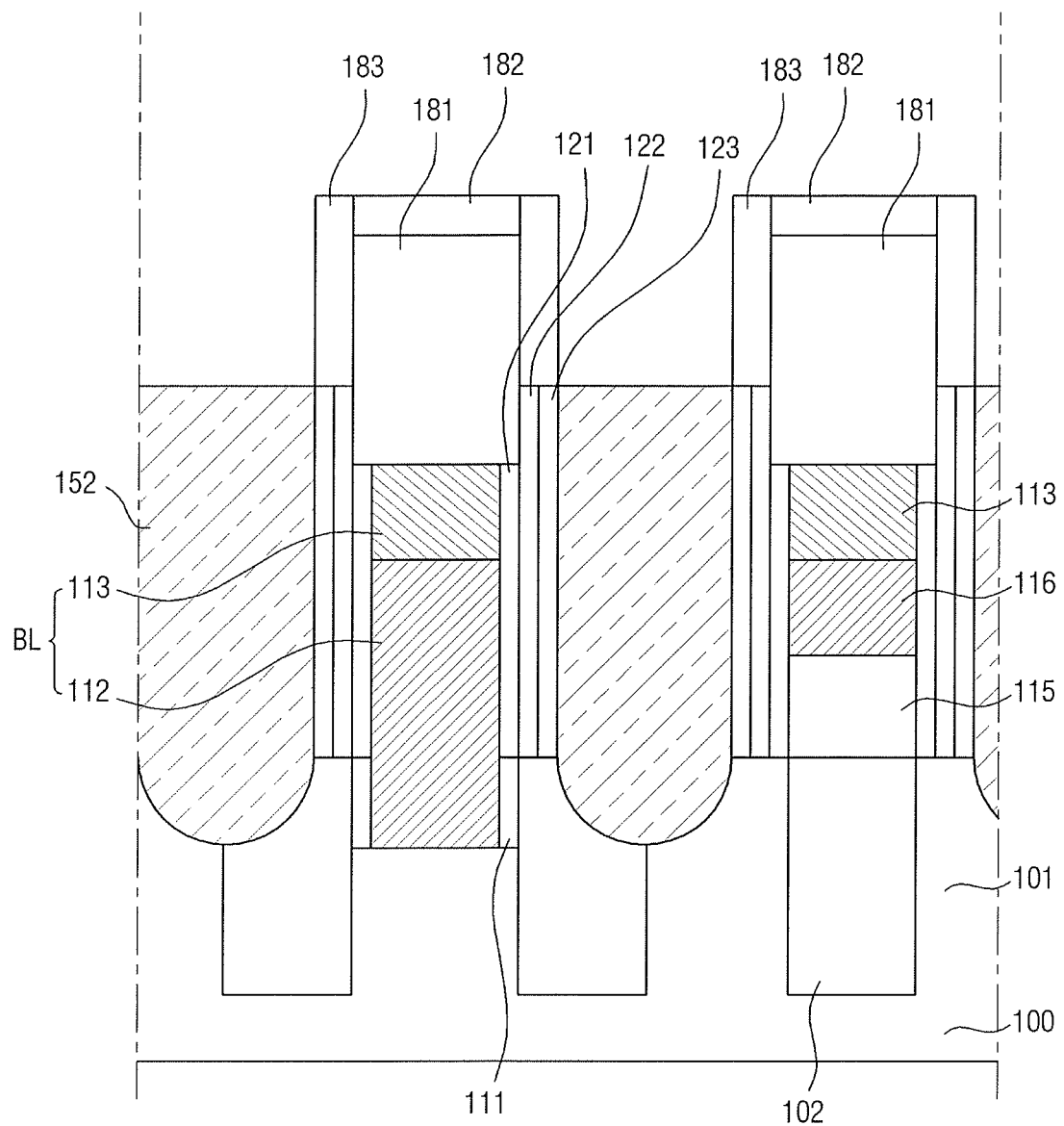

Referring to FIGS. 15B and 15C, after the hard mask 125a is etched back, an air gap capping layer 183 may be formed, and a space surrounded by the air gap capping layer 183 may be filled with the hard mask 125a again. Then, a contact hole 151 may be formed and filled with a contact plug 152.

Figure 15D:
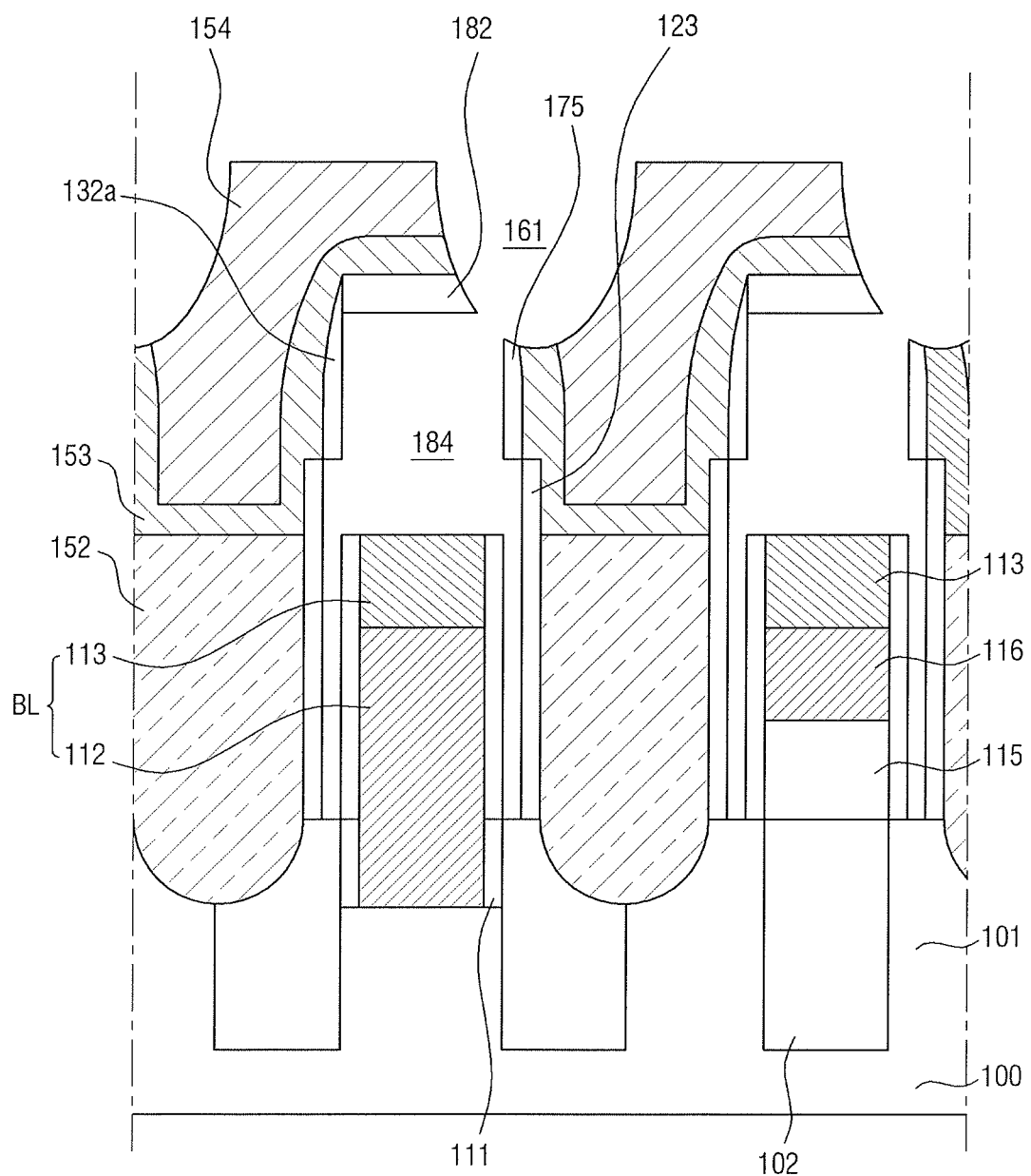

Referring to FIG. 15D, a barrier metal 153 and a landing pad 154 may be formed on the contact hole 151 having an enlarged upper part. Then, a trench 161 may be formed by etching the landing pad 154. A trench 184 may be formed by etching the oxide layer 181, which may be exposed through a lower surface of the trench 161, and the oxide spacer 122.

Figure 15E:
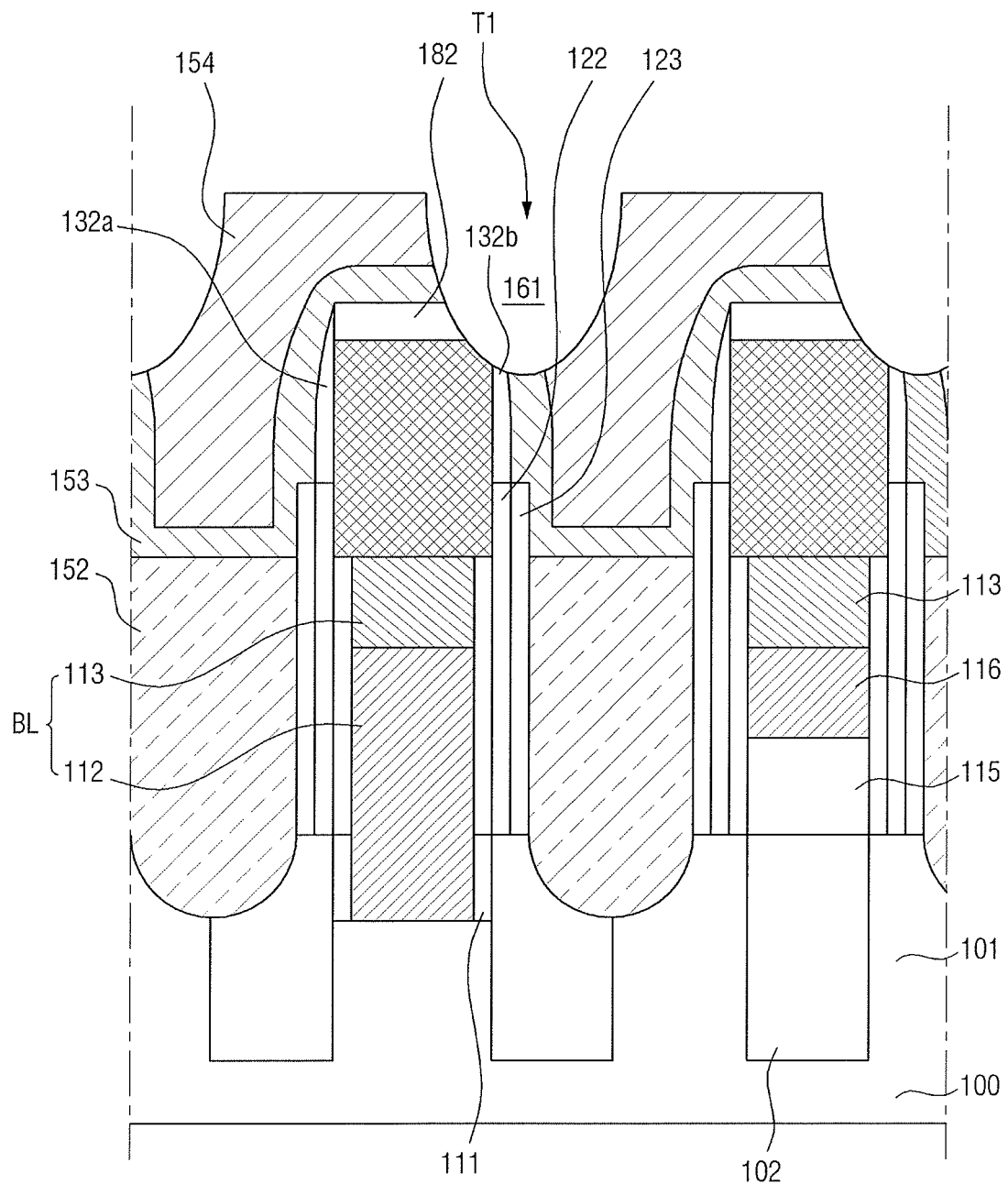

Referring to FIGS. 15E and 4, a partial layer 186 and an air gap spacer AG may be formed by coating the trench 184 with an insulating material.

FIGS. 16A through 16D illustrate views of stages in a method of fabricating a semiconductor device according to an embodiment.

The following description will be made with reference to FIGS. 5, 6, and 16A through 16D. FIGS. 16A through 16D are cross-sectional views taken along the line B-B' of FIG. 5.

A lower bit line spacer 111 may be disposed between active regions 101, and an intermediate insulating layer 201 may be formed on the lower bit line spacer 111. A lower insulating layer 191 may be connected to a word line WL.

Figure 16A:
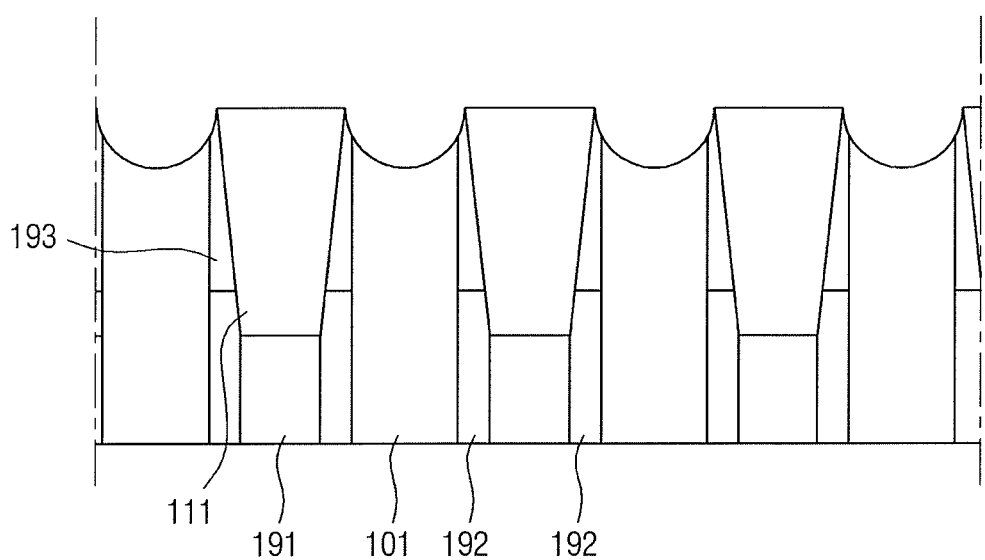
FIGS. 16A through 16D illustrate views of stages in a method of fabricating a semiconductor device according to an embodiment.
Figure 16B:
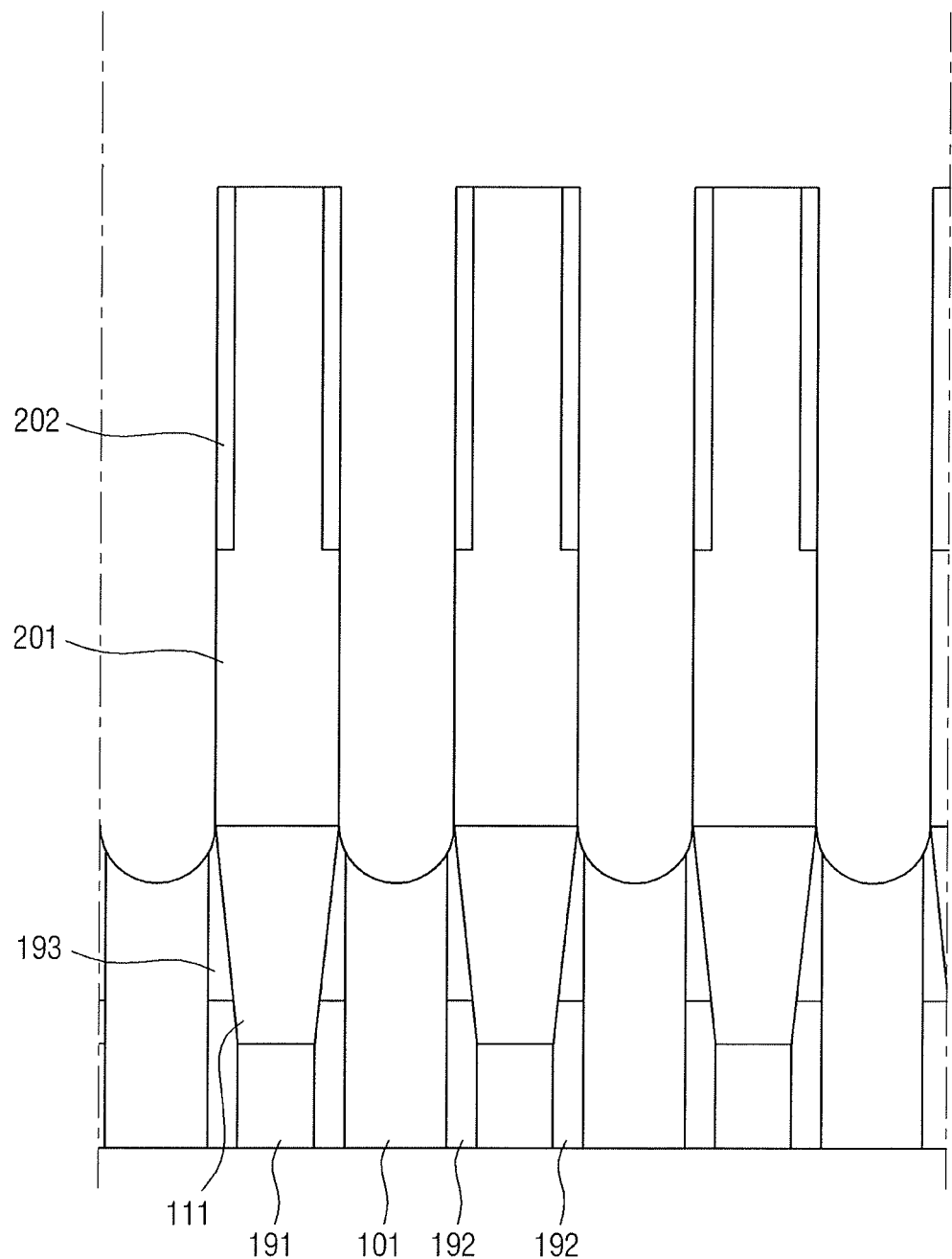

Next, an oxide layer spacer 202 may be formed on sidewalls of the intermediate insulating layer 201. Referring to FIG. 16B, the oxide layer spacer 202 may be formed, for example, on part of the sidewalls of the intermediate insulating layer 201. In an embodiment, the oxide layer spacer 202 may also be formed to cover the whole of the sidewalls of the intermediate insulating layer 201.

Figure 16C:
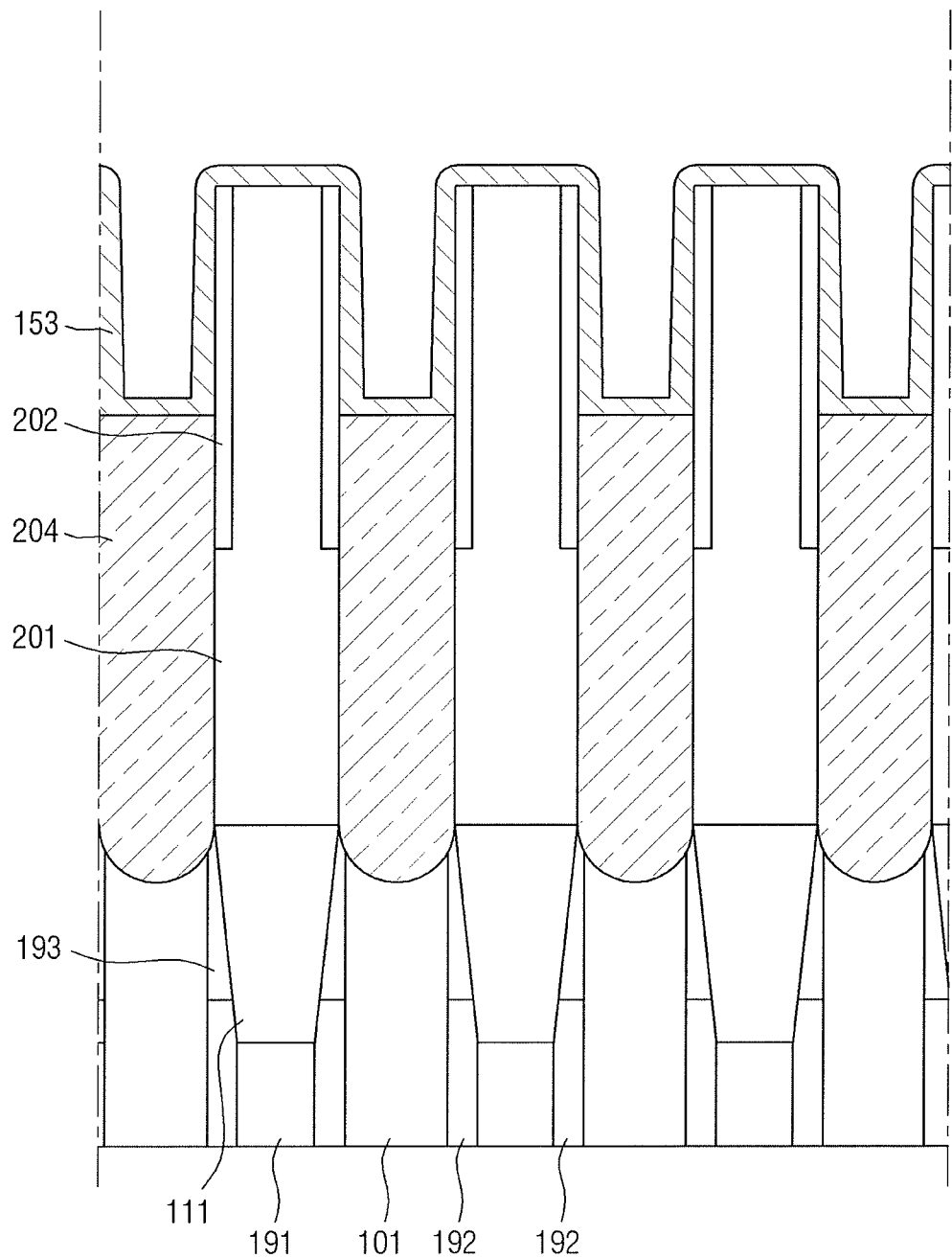

Referring to FIG. 16C, polysilicon 204 may be formed between the intermediate insulating layer 201 and another intermediate insulating layer 201, and a barrier metal 153 may be formed on the polysilicon 204. The polysilicon 204 may be formed by forming polysilicon up to an upper surface of the intermediate insulating layer 201 and then etching back the polysilicon to a predetermined height.

Figure 16D:
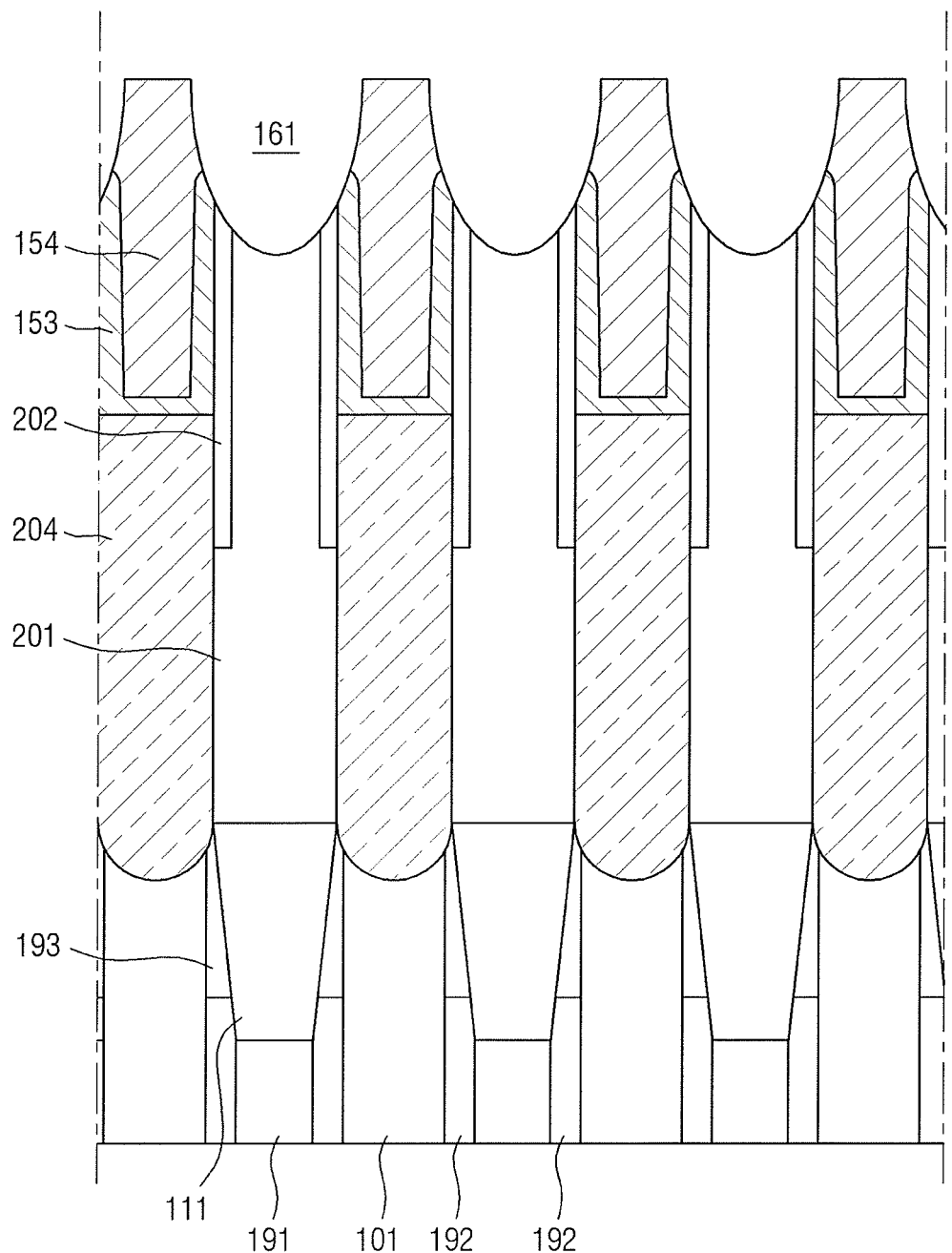

Referring to FIG. 16D, a landing pad 154 may be formed on the barrier metal 153 and then etched to form a trench 161. The oxide layer spacer 202 may be exposed through the trench 161, and the exposed oxide layer spacer 202 may be removed by wet-etching.

Finally, a partial layer 211 may be formed in the space where the oxide layer spacer 202 used to exist.

By way of summation and review, when a distance between conductive patterns included in a DRAM is reduced, a capacitive coupling phenomenon may be caused. To reduce the capacitive coupling phenomenon, a DRAM semiconductor device including an air gap spacer may be used.

Embodiments may provide a semiconductor device including an air gap spacer. Embodiments may also provide a method of fabricating the above semiconductor device.

Embodiments relate to a semiconductor device which may be used in a memory device and a method of manufacturing the semiconductor device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region defined in a semiconductor substrate;
a first contact plug on the semiconductor substrate, the first contact plug being connected to the active region;
a bit line on the semiconductor substrate, the bit line being adjacent to the first contact plug;
a first air gap spacer between the first contact plug and the bit line;
a landing pad on the first contact plug;
a blocking insulating layer on the bit line; and
an air gap capping layer on the first air gap spacer, the air gap capping layer vertically overlapping the first air gap spacer, the air gap capping layer being between the blocking insulating layer and the landing pad,
an upper surface of the blocking insulating layer being at a height equal to or higher than an upper surface of the landing pad.

2. The semiconductor device as claimed in claim 1, wherein the first air gap spacer includes a first air gap vertically overlapped by the landing pad and a second air gap not vertically overlapped by the landing pad.

3. The semiconductor device as claimed in claim 1, wherein a height from the semiconductor substrate to a lowest part of the blocking insulating layer is lower than a height from the semiconductor substrate to a highest part of the first air gap spacer.

4. The semiconductor device as claimed in claim 1, wherein the blocking insulating layer contains silicon nitride.

5. The semiconductor device as claimed in claim 4, wherein the blocking insulating layer includes a silicon oxide layer remaining on an inside of sidewalls thereof.

* * * * *